(12) United States Patent
Aoyama et al.

(10) Patent No.: US 10,170,662 B2
(45) Date of Patent: Jan. 1, 2019

(54) METHOD FOR MANUFACTURING CIRCUIT BOARD, METHOD FOR MANUFACTURING LIGHT-EMITTING DEVICE, AND LIGHT-EMITTING DEVICE

(71) Applicant: SEMICONDUCTOR ENERGY LABORATORY CO., LTD., Atsugi-shi, Kanagawa-ken (JP)

(72) Inventors: Tomoya Aoyama, Kanagawa (JP); Ryu Komatsu, Kanagawa (JP); Takayuki Ohide, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/800,892

(22) Filed: Jul. 16, 2015

(65) Prior Publication Data

US 2016/0020355 A1 Jan. 21, 2016

(30) Foreign Application Priority Data

Jul. 18, 2014 (JP) .................................. 2014-148023
Apr. 22, 2015 (JP) .................................. 2015-087597

(51) Int. Cl.
*H01L 33/00* (2010.01)
*H01L 51/00* (2006.01)
*H01L 21/768* (2006.01)
*H01L 25/075* (2006.01)
(Continued)

(52) U.S. Cl.
CPC .............. *H01L 33/005* (2013.01); *G02B 6/00* (2013.01); *G02F 1/1336* (2013.01); *H01L 21/76825* (2013.01); *H01L 25/0753* (2013.01); *H01L 51/0097* (2013.01); *H05K 1/189* (2013.01); *H05K 3/323* (2013.01); *F21S 6/00* (2013.01);
(Continued)

(58) Field of Classification Search
CPC ............. H01L 33/005; H01L 21/76825; H01L 51/0097
See application file for complete search history.

(56) References Cited

U.S. PATENT DOCUMENTS 8,222,666 B2 7/2012 Hatano
8,367,440 B2 2/2013 Takayama et al.
(Continued)

FOREIGN PATENT DOCUMENTS

JP 2000-150143 5/2000
JP 2003-174153 6/2003
JP 2009-109770 5/2009

*Primary Examiner* — Amar Movva
(74) *Attorney, Agent, or Firm* — Nixon Peabody LLP; Jeffrey L. Costellia

(57) ABSTRACT

A method for manufacturing a circuit board includes a first process, a second process, a third process, and a fourth process. The first process includes a step of providing a circuit and an electrode over a first surface of a first substrate. The second process includes a step of providing a reflective layer on the first surface side of the first substrate or a second surface side of a second substrate. The third process includes a step of attaching the first surface and the second surface to each other with a bonding layer therebetween to face each other so that the reflective layer overlaps with the electrode and the reflective layer surrounds part of the electrode. The fourth process includes a step of irradiating at least part of the reflective layer with laser light from a side opposite to the electrode.

16 Claims, 27 Drawing Sheets

(51) Int. Cl.
  *G02F 1/13357* (2006.01)
  *G02B 6/00* (2006.01)
  *H05K 1/18* (2006.01)
  *H05K 3/32* (2006.01)
  *G02F 1/1335* (2006.01)
  *F21S 6/00* (2006.01)
  *F21Y 105/10* (2016.01)
  *F21Y 115/10* (2016.01)

(52) U.S. Cl.
  CPC ....... *F21Y 2105/10* (2016.08); *F21Y 2115/10* (2016.08); *G02F 2001/133614* (2013.01); *G02F 2202/108* (2013.01); *H01L 2924/0002* (2013.01)

(56) References Cited

U.S. PATENT DOCUMENTS

| | | | |
|---|---|---|---|
| 8,415,208 B2 | 4/2013 | Takayama et al. | |
| 8,956,891 B2 | 2/2015 | Chida | |
| 9,065,034 B2 | 6/2015 | Chida | |
| 2003/0034497 A1 | 2/2003 | Yamazaki et al. | |
| 2005/0260020 A1* | 11/2005 | Weiner | B26D 1/0006 399/398 |
| 2007/0207571 A1* | 9/2007 | Morisue | H01L 27/1214 438/107 |
| 2008/0048562 A1 | 2/2008 | Matsuda | |
| 2009/0108728 A1 | 4/2009 | Ushimaru et al. | |
| 2009/0114915 A1 | 5/2009 | Toriumi | |
| 2010/0045919 A1* | 2/2010 | Chida | H01L 27/1225 349/149 |
| 2010/0117072 A1 | 5/2010 | Ofuji et al. | |
| 2011/0316013 A1 | 12/2011 | Boerner | |
| 2012/0279766 A1* | 11/2012 | Wu | C09D 5/24 174/257 |
| 2013/0240855 A1 | 9/2013 | Chida et al. | |
| 2014/0065430 A1 | 3/2014 | Yamazaki et al. | |
| 2015/0233557 A1 | 8/2015 | Aoyama et al. | |
| 2015/0250038 A1 | 9/2015 | Sakuishi et al. | |
| 2015/0263314 A1 | 9/2015 | Sakuishi et al. | |

\* cited by examiner

FIG. 2A1
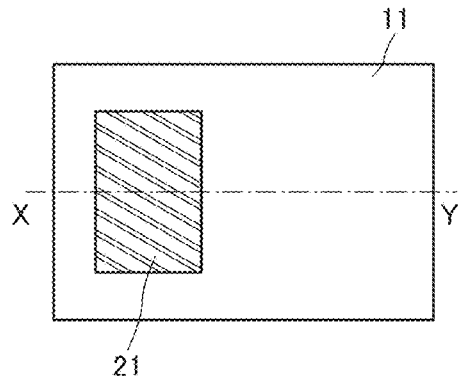
FIG. 2A2
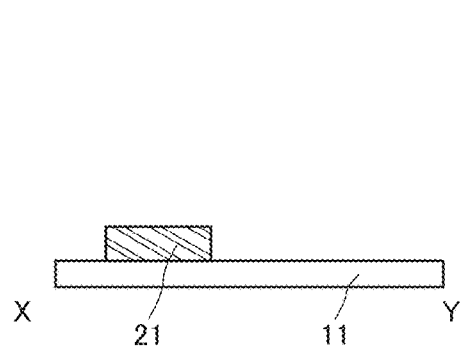
FIG. 2B1
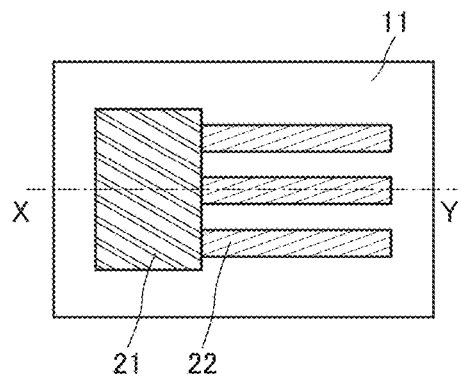
FIG. 2B2
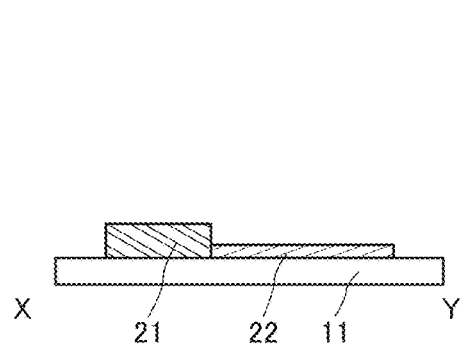
FIG. 2C1
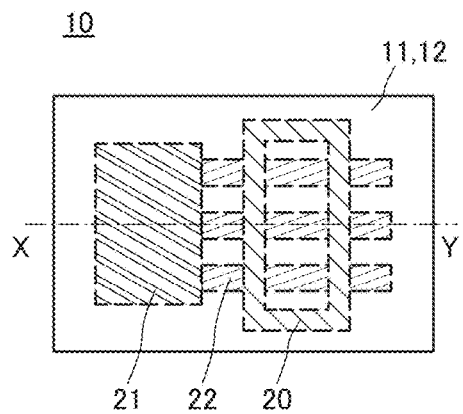
FIG. 2C2
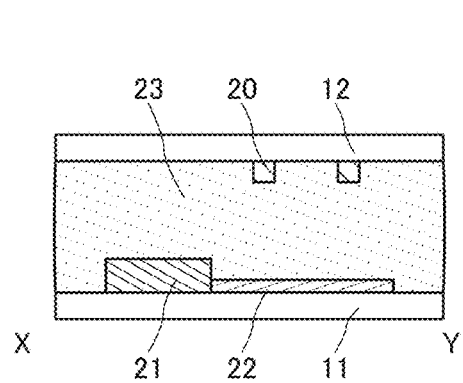

FIG. 3A1
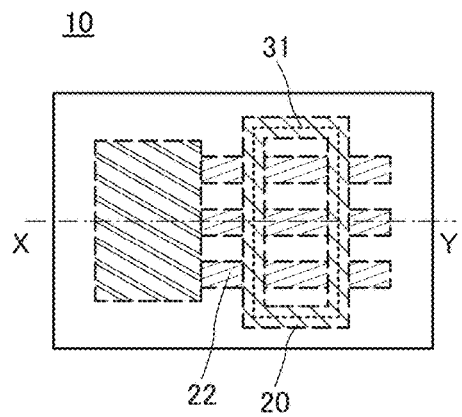
FIG. 3A2
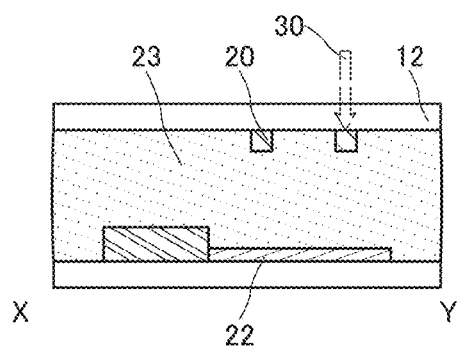
FIG. 3B1
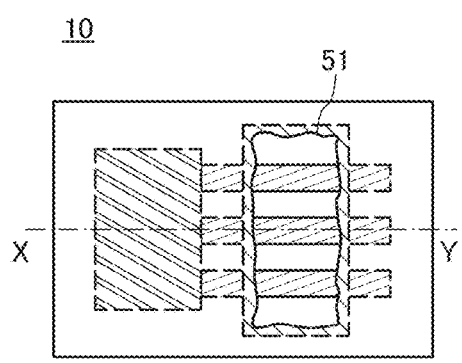
FIG. 3B2
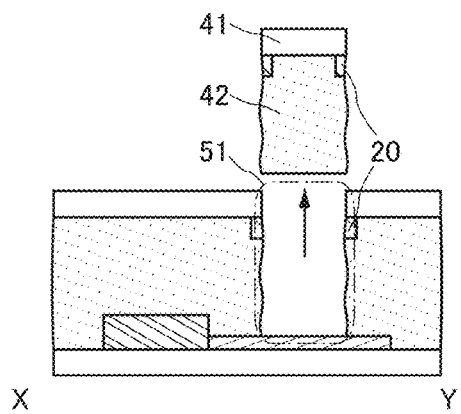
FIG. 3C1
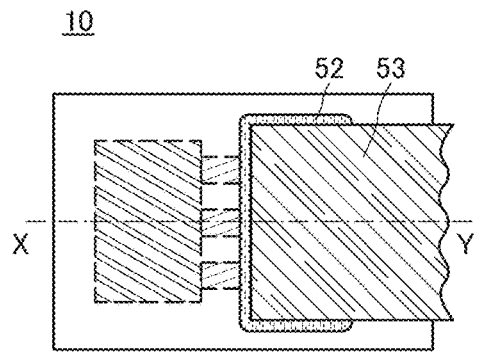
FIG. 3C2
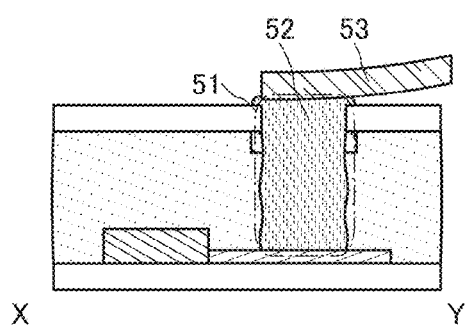

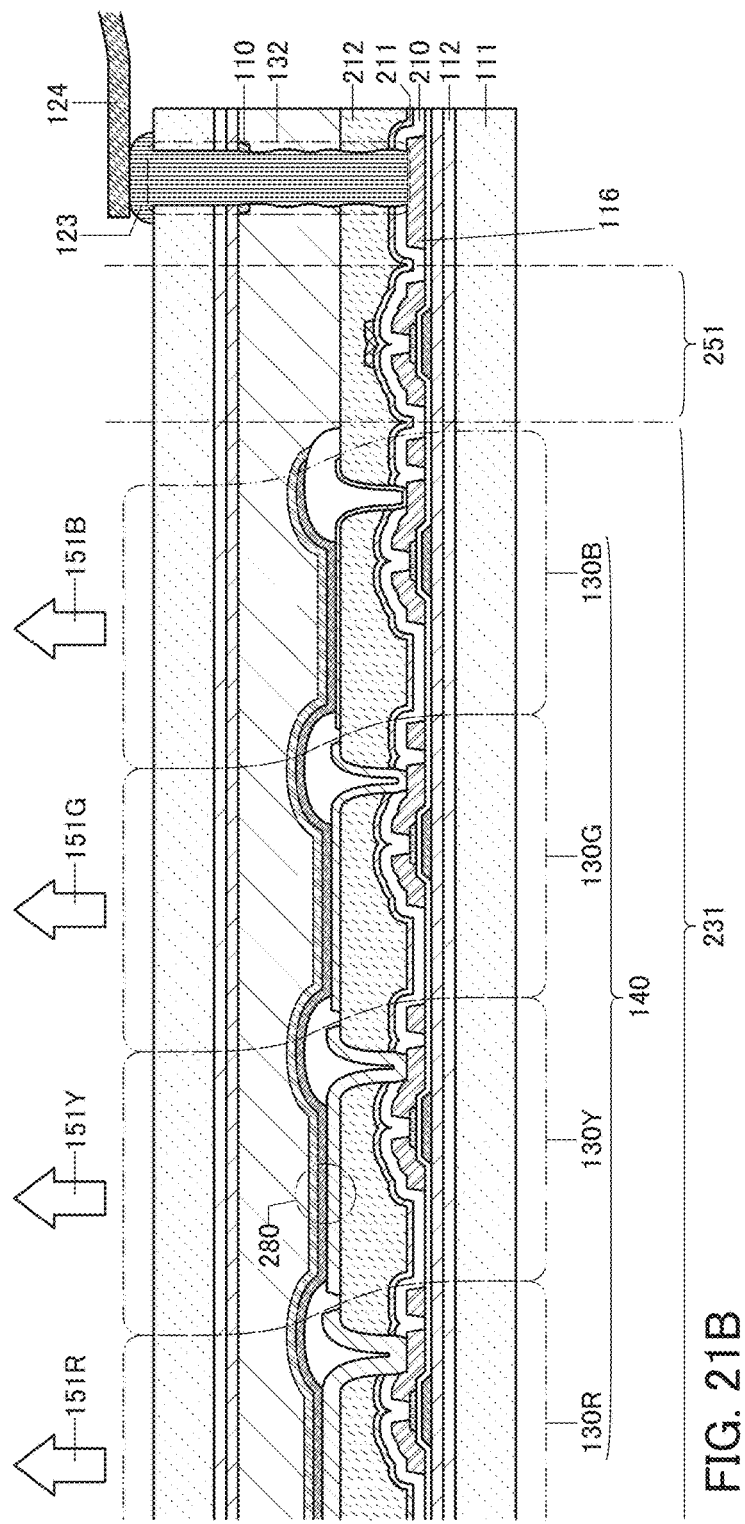
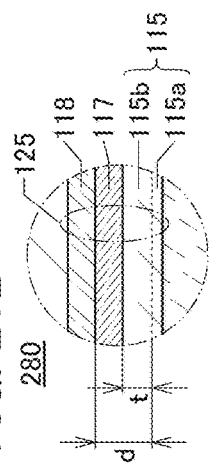

METHOD FOR MANUFACTURING CIRCUIT BOARD, METHOD FOR MANUFACTURING LIGHT-EMITTING DEVICE, AND LIGHT-EMITTING DEVICE

BACKGROUND OF THE INVENTION

1. Field of the Invention

One embodiment of the present invention relates to a method for manufacturing a circuit board. Another embodiment of the present invention relates to a method for manufacturing a light-emitting device. Another embodiment of the present invention relates to a light-emitting device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, an electronic device, a lighting device, an input device, an input/output device, a method for driving any of them, and a method for manufacturing any of them.

A circuit board in this specification generally means a substrate that includes a circuit including wirings. Examples of the circuit board include a semiconductor device, a light-emitting device, and the like. A semiconductor device generally means a device that can function by utilizing semiconductor characteristics. Accordingly, a transistor, a semiconductor element, a semiconductor circuit, an input/output device, a memory device, an imaging device, an electro-optical device, a power generation device (e.g., a thin film solar cell and an organic thin film solar cell), an electronic device, and the like are included in the category of the semiconductor device. A light-emitting device includes, in its category, a display device using a light-emitting element. Furthermore, the light-emitting device may be included in a module in which a light-emitting element is provided with a connector such as an anisotropic conductive film or a tape carrier package (TCP), a module in which a printed wiring board is provided at the end of a TCP, and a module in which an integrated circuit (IC) is directly mounted on a light-emitting element by a chip on glass (COG) method. The light-emitting device may also be included in lighting equipment or the like.

2. Description of the Related Art

In recent years, research and development have been extensively conducted on liquid crystal elements as a display element used in a display region of a display device. In addition, research and development have been extensively conducted on light-emitting elements utilizing electroluminescence (EL). As a basic structure of these light-emitting elements, a layer containing a light-emitting substance is provided between a pair of electrodes. Voltage is applied to this light-emitting element to obtain light emission from the light-emitting substance.

Light-emitting elements are a self-luminous element; thus, a display device using the light-emitting elements has, in particular, advantages such as high visibility, no necessity of a backlight, and low power consumption. The display device using the light-emitting elements also has advantages in that it can be manufactured to be thin and lightweight and has high response speed.

The display device including the display elements can have flexibility; therefore, the use of a flexible substrate for the display device has been proposed.

As a method for manufacturing a display device using a flexible substrate, a technique has been developed in which an oxide layer and a metal layer are formed between a substrate and a semiconductor element, the substrate is separated by utilizing weak adhesion of an interface between the oxide layer and the metal layer, and then the semiconductor element is transferred to another substrate (e.g., a flexible substrate) (Patent Document 1).

Display devices are expected to be applied to a variety of uses and become diversified. For example, a smartphone and a tablet terminal with a touch sensor are being developed as mobile devices.

REFERENCE

Patent Document

[Patent Document 1] Japanese Published Patent Application No. 2003-174153

SUMMARY OF THE INVENTION

In order to supply a signal or electric power to a circuit board and a light-emitting device using a flexible substrate, part of the flexible substrate is sometimes removed by laser light or an edged tool to expose an electrode so that an external electrode such as a flexible printed circuit (FPC) is connected to the electrode.

However, a method in which part of a flexible substrate is removed with an edged tool has a problem in that an electrode included in a light-emitting device is damaged easily and the reliability and manufacturing yield of the light-emitting device are reduced easily. In a method in which part of a flexible substrate is removed by laser light, the laser light might transmit a portion to be removed and therefore a wiring and the like below the portion to be removed might be damaged.

Meanwhile, mobile devices such as a smartphone and a tablet terminal with a touch sensor are required to be compact in size. An external power source such as a battery as well as a circuit board needs to be incorporated into a housing of the mobile device. To reduce the size of the housing of the mobile device, an external electrode that connects the circuit board and the battery or the like to each other needs to have high arrangement flexibility.

An object of one embodiment of the present invention is to provide a method for manufacturing a circuit board or a light-emitting device with little damage to an electrode. Another object of one embodiment of the present invention is to provide a method for manufacturing a circuit board or a light-emitting device with little damage to a display region. Another object of one embodiment of the present invention is to provide a method for manufacturing a highly reliable light-emitting device. Another object of one embodiment of the present invention is to provide a method for manufacturing a light-emitting device with high design flexibility. Another object of one embodiment of the present invention is to provide a highly reliable light-emitting device.

Another object of one embodiment of the present invention is to provide a novel method for manufacturing a circuit board or a light-emitting device. Another object of one embodiment of the present invention is to provide a method for manufacturing a lightweight light-emitting device. Another object of one embodiment of the present invention is to provide a method for manufacturing a thin light-emitting device. Another object of one embodiment of the present invention is to provide a novel light-emitting device. Note that the descriptions of these objects do not disturb the existence of other objects. In one embodiment of the present invention, there is no need to achieve all of these objects. Other objects will be apparent from and can be derived from the description of the specification, the drawings, the claims, and the like.

One embodiment of the present invention is a method for manufacturing a circuit board, including a first process, a second process, a third process, and a fourth process. The first process includes a step of providing a circuit and an electrode over a first surface of a first substrate. The second process includes a step of providing a reflective layer on the first surface side of the first substrate or a second surface side of a second substrate. The third process includes a step of attaching the first surface and the second surface to each other with a bonding layer therebetween to face each other so that the reflective layer overlaps with the electrode and the reflective layer surrounds part of the electrode. The fourth process includes a step of irradiating at least part of the reflective layer with laser light from a side opposite to the electrode.

Another embodiment of the present invention is the method for manufacturing a circuit board including the first process, the second process, the third process, the fourth process, and a fifth process. The second process includes a step of providing the reflective layer over the second surface. In the second process, the second substrate includes a first region in which the second substrate overlaps with a region surrounded by the reflective layer. In the third process, the bonding layer includes a second region in which the bonding layer overlaps with the first region. The fifth process includes a step of removing at least part of the first region of the second substrate and at least part of the second region of the bonding layer.

Another embodiment of the present invention is the method for manufacturing a circuit board in which the first substrate and the second substrate have flexibility.

Another embodiment of the present invention is a method for manufacturing a light-emitting device including a first process, a second process, a third process, a fourth process, a fifth process, a sixth process, a seventh process, an eighth process, and a ninth process. The first process includes a step of providing a first peeling layer over a first surface of a first substrate, a step of providing a first insulating layer over the first peeling layer, a step of providing a terminal electrode over the first insulating layer, a step of providing a second insulating layer over the first insulating layer and the terminal electrode, and a step of providing a light-emitting element over the second insulating layer. The second process includes a step of providing a second peeling layer over a second surface of a second substrate, a step of providing a third insulating layer over the second peeling layer, and a step of providing a reflective layer over the third insulating layer. The third process includes a step of overlapping the first substrate and the second substrate with each other with a bonding layer therebetween in such a manner that the first surface and the second surface face each other so that at least part of the reflective layer overlaps with the terminal electrode and the reflective layer surrounds part of the terminal electrode. The fourth process includes a step of peeling the first substrate and the first peeling layer from the first insulating layer. The fifth process includes a step of providing a third substrate to overlap with the first insulating layer. In the fifth process, the third substrate has flexibility. The sixth process includes a step of peeling the second substrate and the second peeling layer from the third insulating layer. The seventh process includes a step of providing a fourth substrate to overlap with the third insulating layer. In the seventh process, the fourth substrate includes a first region in which the fourth substrate overlaps with a region surrounded by the reflective layer, the bonding layer includes a second region in which the bonding layer overlaps with the first region, and the fourth substrate has flexibility. The eighth process includes a step of irradiating at least part of the reflective layer with laser light from the fourth substrate side. The ninth process includes a step of removing at least part of the first region of the fourth substrate and at least part of the second region of the bonding layer.

Another embodiment of the present invention is a light-emitting device including a first substrate, a second substrate, a terminal electrode, a light-emitting element, and a reflective layer. A first surface of the first substrate is provided so as to face a second surface of the second substrate. The terminal electrode and the light-emitting element are provided over the first surface. The terminal electrode and the light-emitting element are electrically connected to each other. The reflective layer is provided over the second surface. The reflective layer is provided so that the reflective layer overlaps with the terminal electrode and the reflective layer surrounds part of the terminal electrode.

One embodiment of the present invention provides a method for manufacturing a light-emitting device with little damage to an electrode. One embodiment of the present invention provides a method for manufacturing a light-emitting device with little damage to a display region. One embodiment of the present invention provides a method for manufacturing a highly reliable light-emitting device. One embodiment of the present invention provides a method for manufacturing a light-emitting device with high design flexibility. One embodiment of the present invention provides a highly reliable light-emitting device.

One embodiment of the present invention provides a novel method for manufacturing a circuit board or a light-emitting device. One embodiment of the present invention provides a method for manufacturing a lightweight light-emitting device. One embodiment of the present invention provides a method for manufacturing a thin light-emitting device. One embodiment of the present invention provides a novel light-emitting device.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

FIGS. 2A1, 2A2, 2B1, 2B2, 2C1, and 2C2 illustrate a method for manufacturing a circuit board of an embodiment.

FIGS. 3A1, 3A2, 3B1, 3B2, 3C1, and 3C2 illustrate a method for manufacturing a circuit board of an embodiment.

FIGS. 21A and 21B illustrate a structure example of a light-emitting device of an embodiment.

DETAILED DESCRIPTION OF THE INVENTION

Figure 1A:
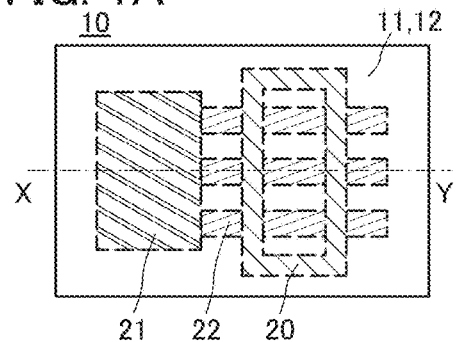
FIGS. 1A to 1H illustrate structure examples of a circuit board of an embodiment.

Embodiments will be described in detail with reference to the accompanying drawings. Note that the present invention is not limited to the description below, and it is understood easily by those skilled in the art that various changes and modifications can be made without departing from the spirit and scope of the present invention. Therefore, the present invention should not be construed as being limited to the description in the following embodiments. In the structures of the present invention to be described below, the same portions or portions having similar functions are denoted by the same reference numerals in different drawings, and explanation thereof will not be repeated.

Note that in each drawing described in this specification, the size, the layer thickness, or the region of each component may be exaggerated or each component may be omitted in some cases for clarity of the invention. Therefore, embodiments of the present invention are not limited to such a scale. Especially in a top view, some components might not be illustrated to facilitate understanding.

The position, size, range, and the like of each component illustrated in the drawings and the like are not accurately represented in some cases to facilitate understanding of the invention. Therefore, the disclosed invention is not necessarily limited to the position, the size, range, and the like disclosed in the drawings and the like. For example, in the actual manufacturing process, a resist mask or the like might be unintentionally reduced in size by treatment such as etching, which might not be illustrated to facilitate understanding.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components.

In this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Embodiment 1

In this embodiment, a configuration example of a circuit board 10 of one embodiment of the present invention will be described with reference to FIGS. 1A to 1H. A method for manufacturing the circuit board will be described with reference to FIGS. 2A1, 2A2, 2B1, 2B2, 2C1, and 2C2 and FIGS. 3A1, 3A2, 3B1, 3B2, 3C1, and 3C2.

[Structure Example of Circuit Board]

Figure 1B:
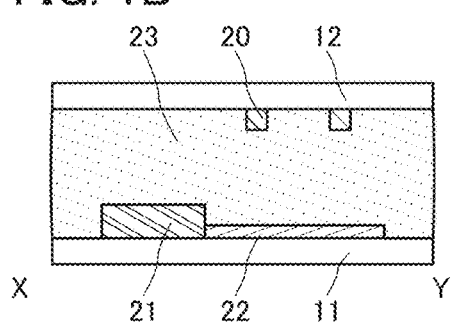

FIGS. 1A and 1B schematically illustrate a circuit board described as an example in this embodiment. FIG. 1A is a top view of the circuit board 10, and FIG. 1B is a cross-sectional view taken along the line X-Y in FIG. 1A.

The circuit board 10 includes a reflective layer 20, a circuit 21, and an electrode 22. The circuit 21 and the electrode 22 are provided over a first surface of a first substrate 11. The reflective layer 20 is provided over a second surface of a second substrate 12. The first surface of the first substrate 11 and the second surface of the second substrate 12 are attached to each other with a bonding layer 23 provided therebetween.

Figure 1C:
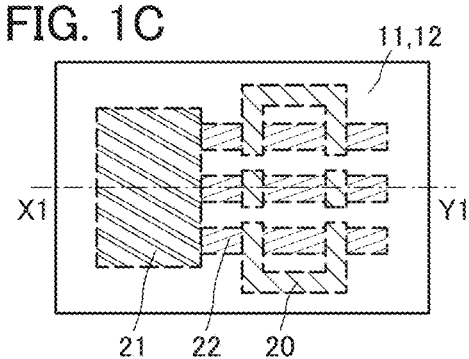
Figure 1D:
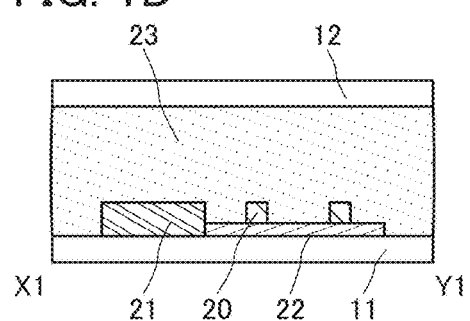
Figure 1E:
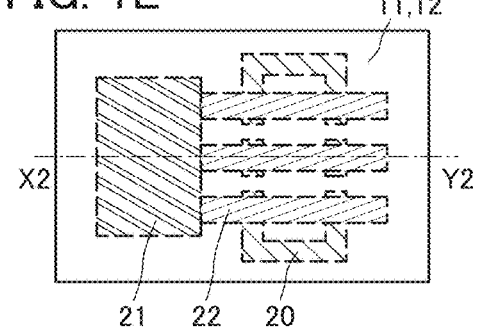
Figure 1F:
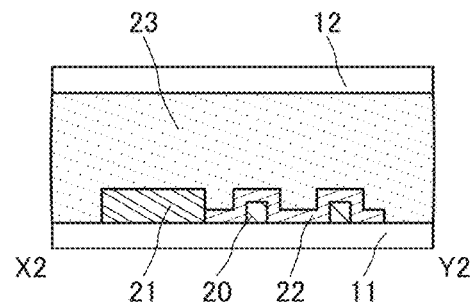
Figure 1G:
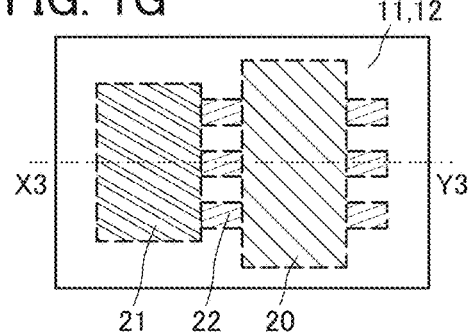
Figure 1H:
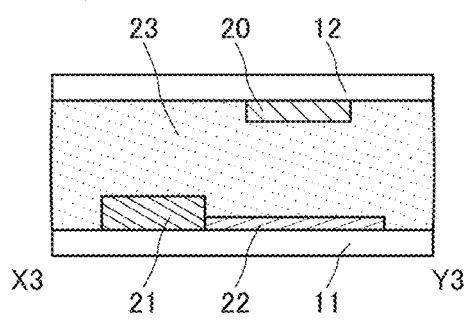

The reflective layer 20 is provided over the second surface of the second substrate 12 as illustrated in FIG. 1B but may be provided over the first surface of the first substrate 11. FIGS. 1C and 1D illustrate a circuit board in which the reflective layer 20 is provided between the bonding layer 23 and the electrode 22. FIGS. 1E and 1F illustrate a circuit board in which the reflective layer 20 is provided between the first substrate 11 and the electrode 22.

The reflective layer 20 is provided to overlap with the electrode 22 and surround part of the electrode 22 when seen from the direction perpendicular to the first substrate 11 (see FIG. 1A). A closed curve may be formed with the reflective layer 20, or the reflective layer 20 may be divided into plural line segments. In the case where the reflective layer 20 and the electrode 22 are provided to be in contact with each other as illustrated in FIGS. 1C and 1D or FIGS. 1E and 1F, it is preferable that the reflective layer 20 be divided so that a plurality of electrodes 22 are not connected to one another through the reflective layer 20 (see FIGS. 1C and 1E). In the case where the plurality of electrodes 22 are provided, the plurality of electrodes 22 can be prevented from being short-circuited. Alternatively, the reflective layer 20 may be formed without any space in a region surrounding part of the electrode 22 (see FIGS. 1G and 1H).

The circuit 21 is electrically connected to the electrode 22. In the case where the circuit 21 includes a semiconductor element, a light-emitting element, and the like, part of the electrode 22 can be used as a terminal electrode for connecting each element to an external electrode. To use part of the electrode 22 as a terminal electrode, it is necessary to expose part of the electrode 22 by partly removing the substrate and the bonding layer.

In the case where part of the substrate is removed with an edged tool such as a scriber or a cutter, the electrode or the circuit in the vicinity of a region where the electrode is to be exposed might be damaged and thus the process yield might be reduced. Moreover, in the case where a region of the substrate to be removed is irradiated with laser light, the laser light is transmitted through the region of the substrate to be removed; thus, a wiring below the portion to be removed might be damaged.

In the circuit board 10 of one embodiment of the present invention, the substrate 12 and the bonding layer 23 can be removed without damaging the electrode 22 by providing a region irradiated with laser light with the reflective layer 20 that reflects the laser light.

The reflective layer 20 is irradiated with the laser light from the side opposite to the electrode 22 side. Specifically, in the case where the reflective layer 20 is placed closer to the second substrate 12 than the electrode 22 is, part of the second substrate 12, or part of the second substrate 12 and part of the bonding layer 23 can be removed by emitting the laser light 30 from the second substrate 12 side (see FIGS. 1B, 1D, and 1H). In the case where the reflective layer 20 is placed closer to the first substrate 11 than the electrode 22 is, part of the first substrate 11 can be removed by emitting the laser light 30 from the first substrate 11 side (see FIG. 1F).

The reflective layer 20 is formed of a material with a reflectance of preferably as high as 30% or more and further preferably as high as 70% or more with respect to the irradiation light. It is also preferable that the reflective layer 20 be formed of a material having an excellent heat resistance property so that it does not change with heat. Description of a reflective layer 110 in Embodiment 2 can be referred to for the material that can be used for the reflective layer 20 and the thickness of the reflective layer 20.

There is no particular limitation on the first substrate 11 and the second substrate 12. Examples of the substrates include a semiconductor substrate (e.g., a single crystal substrate or a silicon substrate), a silicon on insulator (SOI) substrate, a glass substrate, a quartz substrate, a plastic substrate, a metal substrate, an attachment film, paper including a fibrous material, a base material film, and the like. Description of a substrate 111 and a substrate 121 in Embodiment 2 can be referred to for the material that can be used for the first substrate 11 and the second substrate 12.

Note that it is preferable that either or both of the first substrate 11 and the second substrate 12 have flexibility. A substrate thin enough to have flexibility is easily removed by laser irradiation.

The electrode 22 can be formed using a conductive material. Description of a terminal electrode 116 in Embodiment 2 can be referred to for the material that can be used for the electrode 22.

[Example of Manufacturing Method of Circuit Substrate]

A method for manufacturing the circuit board 10 in FIGS. 1A and 1B described in the above structure example and a method for connecting an external electrode to the circuit board 10 will be described with reference to FIGS. 2A1 to 2C2 and FIGS. 3A1 and 3C2.

First, the first substrate 11 is prepared, and the circuit 21 is formed over the first surface of the first substrate 11 (see FIGS. 2A1 and 2A2).

Note that in the case where the reflective layer 20 is provided between the first substrate 11 and the electrode 22 as in FIGS. 1E and 1F, the reflective layer 20 is formed over the first surface of the first substrate 11 at this time.

Then, the electrode 22 is formed over the first surface of the first substrate 11. The electrode 22 is electrically connected to the circuit 21 (see FIGS. 2B1 and 2B2). The electrode 22 may be formed at the same time as the circuit 21 or may be formed prior to the circuit 21.

Note that in the case where the reflective layer 20 is provided between the electrode 22 and the bonding layer 23 as in FIGS. 1C and 1D, the reflective layer 20 is formed over the electrode 22 at this time. In the case where the reflective layer 20 is provided over the electrode 22, an insulating film may be formed between the reflective layer 20 and the electrode 22. With a structure in which the insulating film prevents contact between the reflective layer 20 and the electrode 22, the reflective layer 20 can be formed to have a closed curve as in the case where the reflective layer 20 is formed on the second surface of the second substrate 12. Laser irradiation performed on a subsequent step can be prevented from damaging the first substrate 11 by forming the reflective layer 20 without any space.

Next, the second substrate 12 is prepared, and the reflective layer 20 is formed on the second surface of the second substrate 12 to have a closed curve. Then, the first surface of the first substrate 11 and the second surface of the second substrate 12 are attached to each other with the bonding layer 23 provided therebetween, in a position where the closed curve of the reflective layer 20 surrounds part of the electrode 22, when overlap of the first substrate 11 and the second substrate 12 is seen from the direction perpendicular to the first substrate 11 (see FIGS. 2C1 and 2C2). At this time, the circuit board 10 in FIGS. 1A and 1B is completed.

Next, the reflective layer 20 is irradiated with the laser light 30 from the second substrate 12 side (see FIGS. 3A1 and 3A2). A periphery of the region of the electrode 22 to be exposed, that is, a locus 31 is irradiated with the laser light 30, so that the second substrate 12 and the bonding layer 23 can be easily removed in a subsequent step. At this time, the reflective layer 20 can prevent the laser light 30 from reaching and damaging the electrode 22.

As the laser light 30, infrared light, visible light, or ultraviolet light emitted from a halogen lamp, a high pressure mercury lamp, or the like can be used. In addition, as the laser light 30, intense light such as continuous wave laser light or pulsed laser light can be used. Description of laser light 220 in Embodiment 2 can be referred to for the features of the laser light 30.

Next, part of a region (hereinafter referred to as a first region 41) of the second substrate 12 overlapping with a region surrounded by the locus 31 and part of a region (hereinafter referred to as a second region 42) of the bonding layer 23 overlapping with the region surrounded by the locus 31 are removed from the circuit board 10 (see FIGS. 3B1 and 3B2). At this time, part of the reflective layer 20 is removed at the same time. Accordingly, a portion of the electrode 22 serving as a terminal electrode is exposed and an opening 51 is formed. Part of the reflective layer 20 is removed through this step, and the other part remains in the circuit board 10.

The first region 41 and the second region 42 may be removed by applying mechanical force. For example, the first region 41 and the second region 42 can be removed by bonding an adhesive tape or the like to the first region 41 and then pulling the adhesive tape or the like. Alternatively, the first region 41 and the second region 42 may be pulled while being wound by rolling a structure body, such as a cylinder, having a rotation axis and a suction mechanism on its surface on a surface of the first region 41.

At this time, part of the electrode 22 can be exposed easily by pulling the first region by lowering adhesion at an interface between the bonding layer 23 and the region of the electrode 22 serving as a terminal electrode. For example, a film having low adhesion to the electrode 22 is formed over the region of the electrode 22 serving as a terminal electrode, thereby being removed together with the first region 41 and the second region 42.

Next, a connector 52 is formed in the opening 51, and an external electrode 53 is formed over the connector 52 (see FIGS. 3C1 and 3C2). The connector 52 preferably has anisotropic conductivity. As the connector 52, an anisotropic conductive film (ACF) or an anisotropic conductive paste (ACP) can be used. For example, an FPC can be used as the external electrode 53.

This embodiment can be combined with any other embodiment as appropriate.

Embodiment 2

Figure 4A:
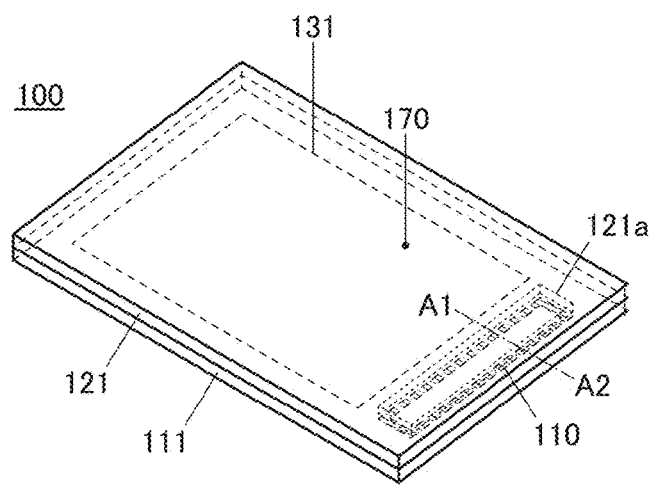
FIGS. 4A and 4B illustrate a structure example of a light-emitting device of an embodiment.
Figure 4B:
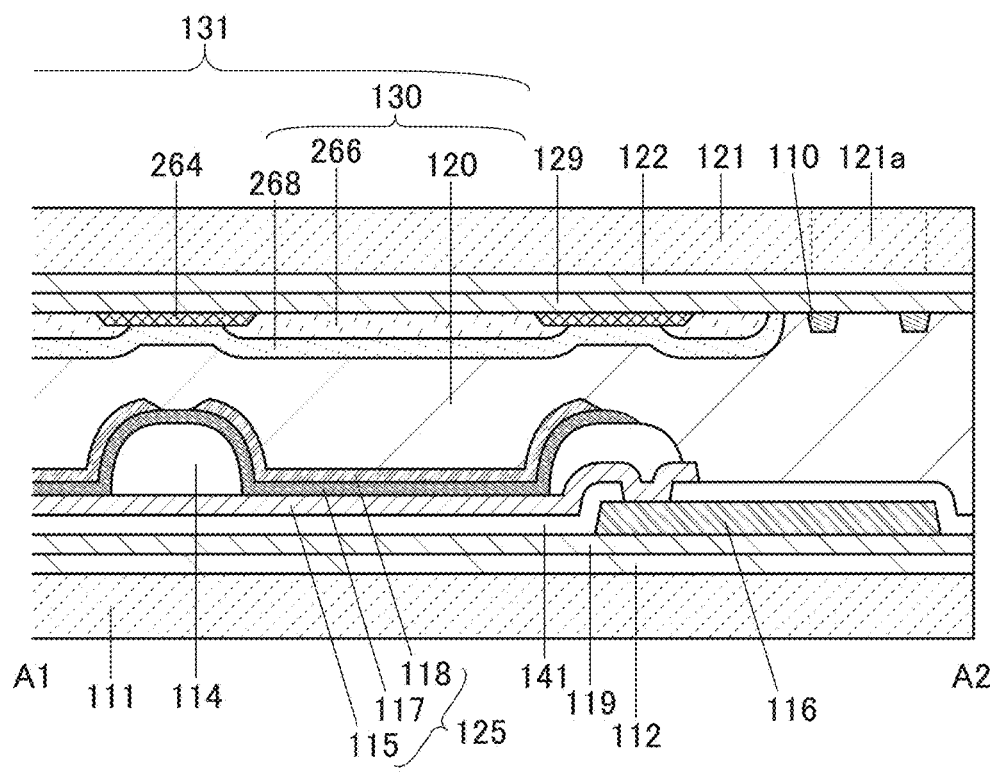

A structure example of a light-emitting device 100 of one embodiment of the present invention will be described with reference to FIGS. 4A and 4B, FIGS. 5A to 5C, FIGS. 6A and 6B, and FIGS. 7A and 7B. FIG. 4A is a perspective view of the light-emitting device 100, and FIG. 4B is a cross-sectional view taken along the dashed-dotted line A1-A2 in FIG. 4A. Some components are not illustrated in FIG. 4A for easy understanding.

[Structure Example of Light-Emitting Device]

The light-emitting device 100 described in this embodiment includes a display region 131. The display region 131 includes a plurality of pixels 130. One pixel 130 includes at least one light-emitting element 125.

The light-emitting device 100 described in this embodiment includes an electrode 115, an EL layer 117, an electrode 118, a partition 114, and the terminal electrode 116. The light-emitting device 100 further includes an insulating layer 141 over the terminal electrode 116, and the electrode 115 and the terminal electrode 116 are electrically connected to each other in an opening provided in the insulating layer 141. The partition 114 is provided over the electrode 115, the EL layer 117 is provided over the electrode 115 and the partition 114, and the electrode 118 is provided over the EL layer 117.

The light-emitting element 125 is provided over the substrate 111 with a bonding layer 112, an insulating layer 119, and the insulating layer 141 provided therebetween. The light-emitting element 125 includes the electrode 115, the EL layer 117, and the electrode 118.

The light-emitting device 100 described in this embodiment includes the substrate 121 provided over the electrode 118 with a bonding layer 120 provided therebetween. In addition, the substrate 121 is provided with a light-blocking layer 264, a coloring layer (also referred to as a color filter) 266, and an overcoat layer 268 with a bonding layer 122 and an insulating layer 129 provided therebetween.

The substrate 121 is provided with the reflective layer 110 with the bonding layer 122 and the insulating layer 129 provided therebetween. The reflective layer 110 is provided to overlap with the terminal electrode 116 and surround part of the terminal electrode 116 when seen from the direction perpendicular to the first substrate 111 (hereinafter referred to as "in a plan view"). As illustrated in FIG. 4A, a closed curve may be formed with the reflective layer 110, or the reflective layer 110 may be divided into plural line segments. Note that a portion of the substrate 121 overlapping with a region surrounded by the reflective layers 110 is referred to as a portion 121a.

Figure 5A:
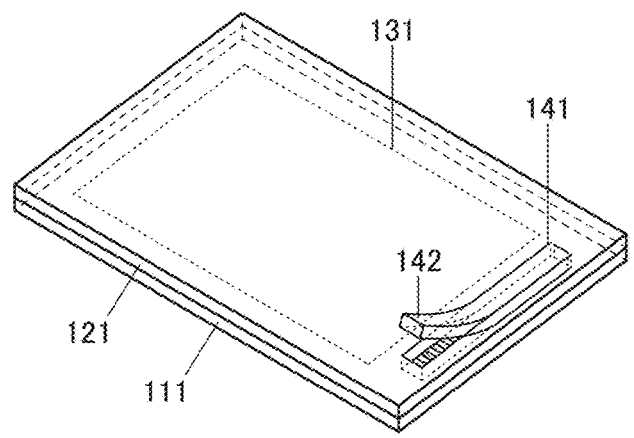
FIGS. 5A to 5C illustrate a structure example and a method for manufacturing a light-emitting device of an embodiment.
Figure 5B:
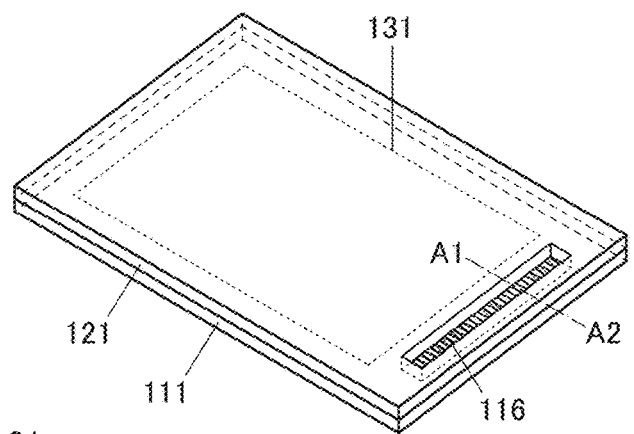
Figure 5C:
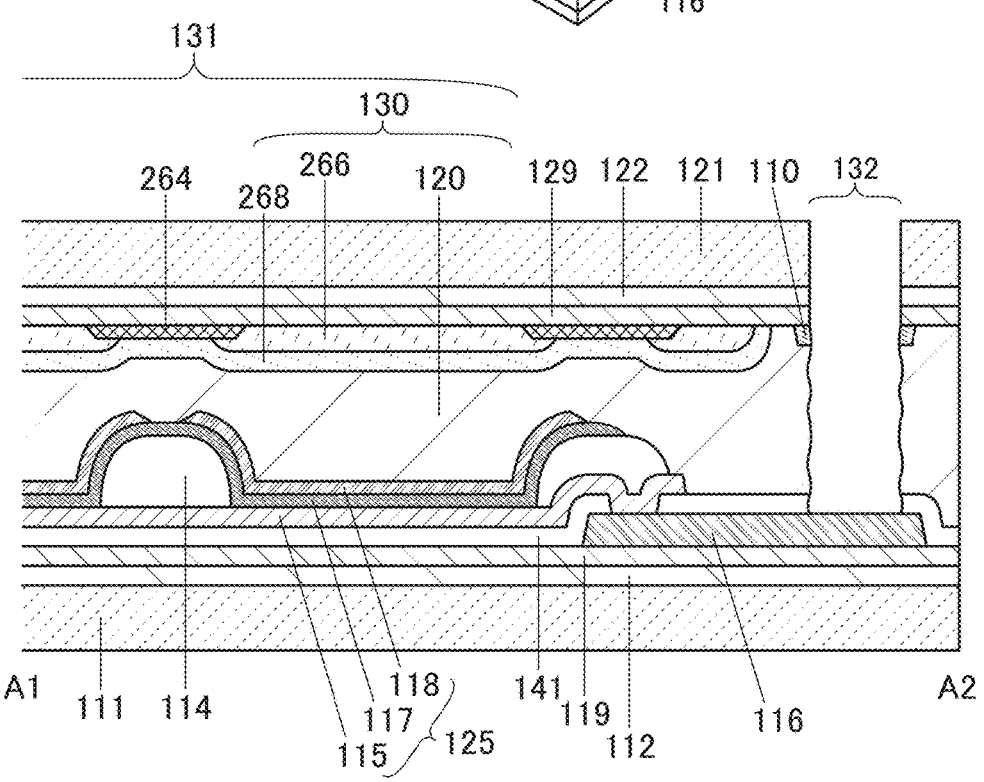

Part of the terminal electrode 116 can be exposed in such a manner that the reflective layer 110 is irradiated with laser light from the substrate 121 side and the layers (the bonding layer 122, the insulating layer 129, and the bonding layer 120) between part of the portion 121a and the terminal electrode 116 overlapping with the part are separated from the light-emitting device 100 as illustrated in FIGS. 5A to 5C. FIG. 5A is a perspective view illustrating a state during a separation step of the layers between the part of the portion 121a and the terminal electrode 116 overlapping with the part. FIG. 5B is a perspective view illustrating a state after the separation step. FIG. 5C is a cross-sectional view taken along the dashed-dotted line A1-A2 in FIG. 5B. The laser irradiation step and the separation step of the layers between the part of the portion 121a and the terminal electrode 116 overlapping with the part will be described in detail in an example of a manufacturing method.

The layers between the part of the portion 121a and the terminal electrode 116 overlapping with the part are removed to form an opening 132, so that part of the terminal electrode 116 can be exposed.

Note that part of the reflective layer 110 remains in the light-emitting device 100 after the formation of the opening 132. The part of the reflective layer 110 is placed so as to surround the opening 132, in contact with the insulating layer 129. Therefore, in some cases, occurrence of breaking or cracking (also referred to as a crack) of the insulating layer 129 from the opening 132 side can be inhibited when the opening 132 is formed or when the light-emitting device 100 is used in connection with an external electrode which will be described later.

Figure 6A:
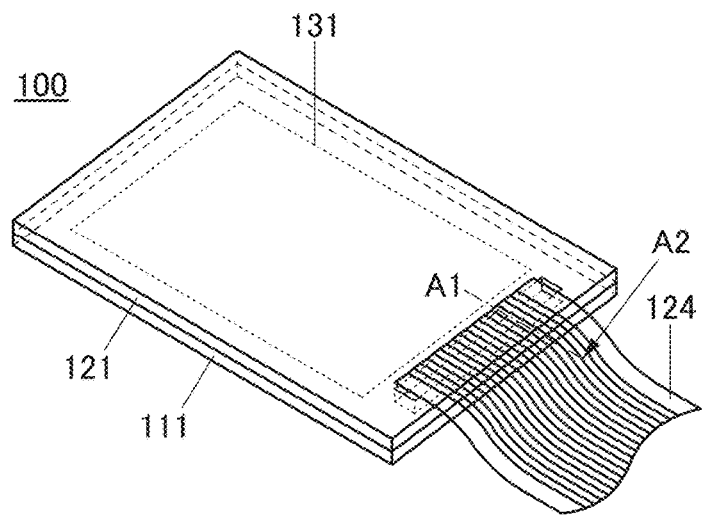
FIGS. 6A and 6B illustrate a structure example of a light-emitting device of an embodiment.
Figure 6B:
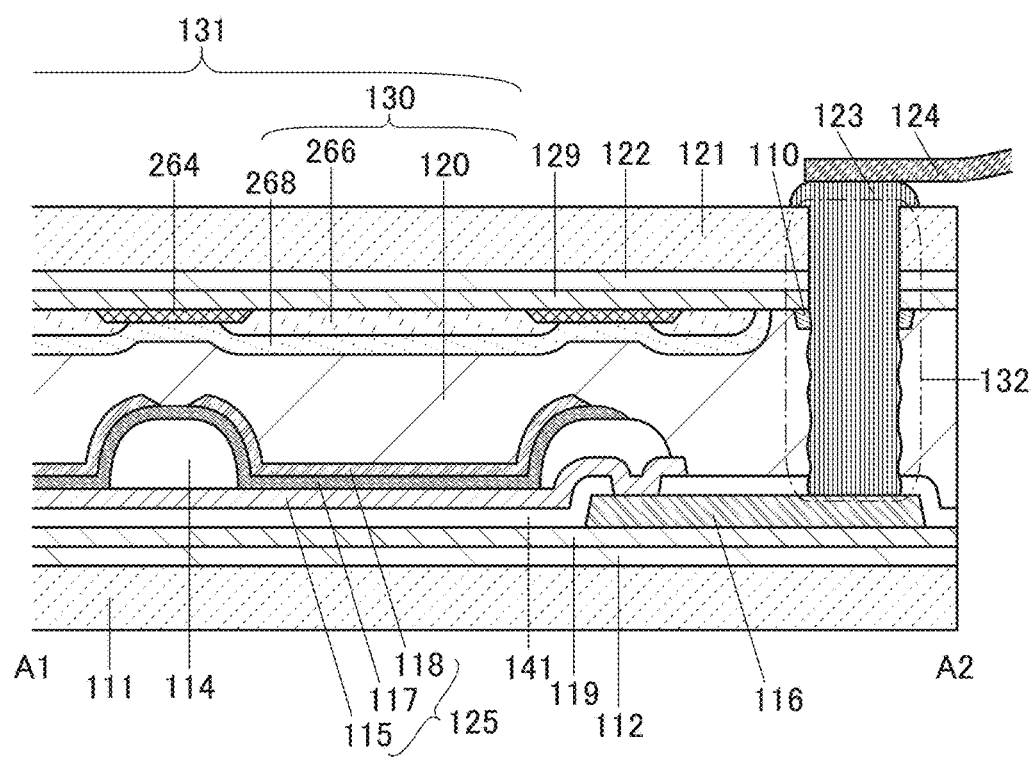

As illustrated in FIGS. 6A and 6B, an external electrode 124 and the terminal electrode 116 can be electrically connected to each other through an anisotropic conductive connection layer 123 in the opening 132. Thus, a region of the substrate 111 overlapping with the opening 132 is also called an external electrode connection region. FIG. 6A is a perspective view of the light-emitting device 100 to which the external electrode 124 is connected, and FIG. 6B is a cross-sectional view taken along the dashed-dotted line A1-A2 in FIG. 6A.

Figure 7A:
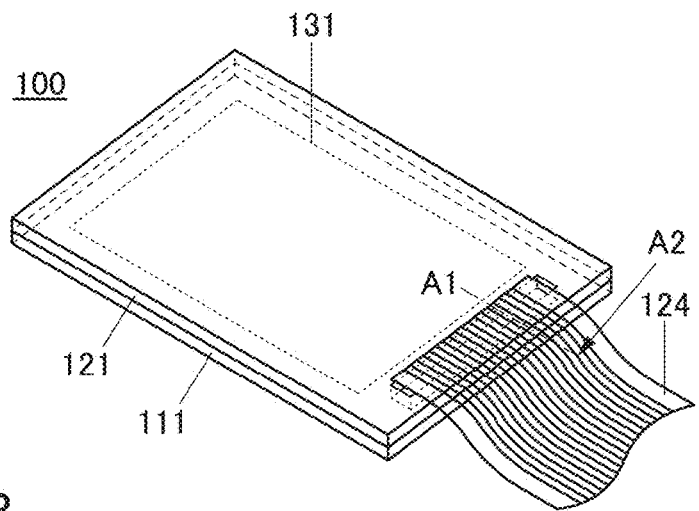
FIGS. 7A and 7B illustrate a structure example of a light-emitting device of an embodiment.
Figure 7B:
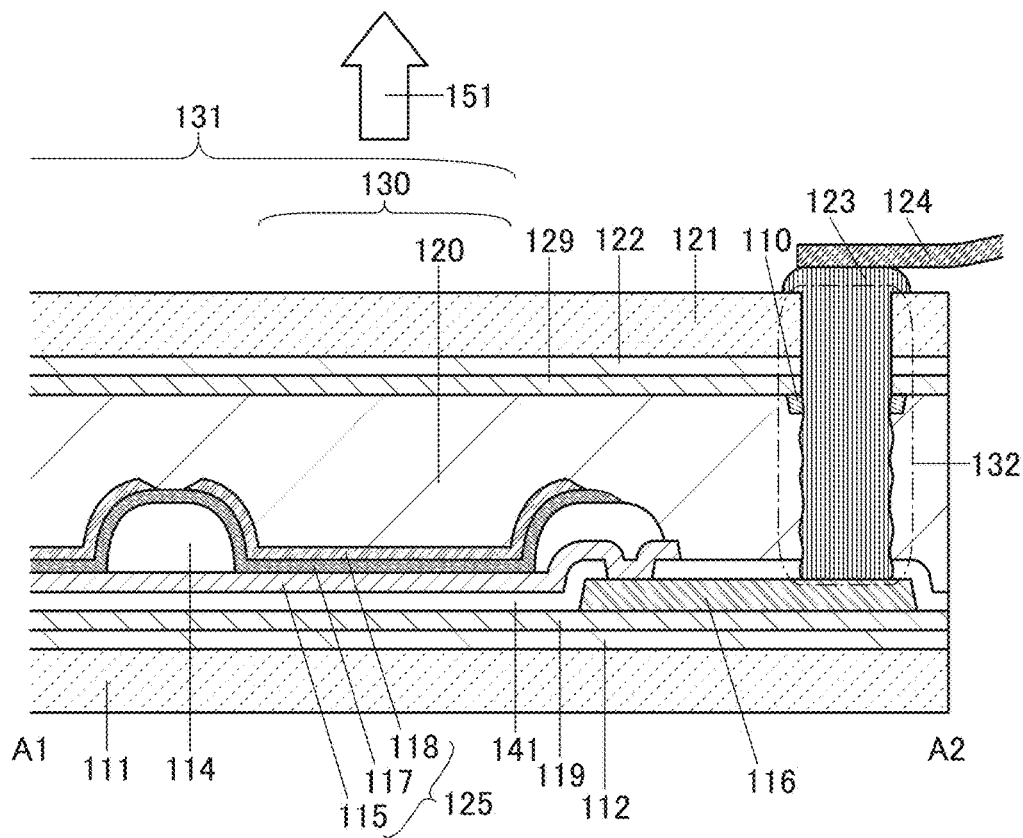

Note that as illustrated in FIGS. 7A and 7B, it is possible not to provide the light-blocking layer 264, the coloring layer 266, and the overcoat layer 268 in the light-emitting device 100. FIG. 7A is a perspective view of the light-emitting device 100 in which the light-blocking layer 264, the coloring layer 266, and the overcoat layer 268 are not provided, and FIG. 7B is a cross-sectional view taken along the dashed-dotted line A1-A2 in FIG. 7A.

In particular, in the case where the EL layer 117 is provided by what is called side-by-side patterning in which the colors of the lights 151 emitted from different pixels are different, the coloring layer 266 may be provided or is not necessarily provided.

When at least one or all of the light-blocking layer 264, the coloring layer 266, and the overcoat layer 268 are not provided, the light-emitting device 100 can achieve a reduction in manufacturing cost, yield improvement, or the like. Moreover, the light 151 can be emitted efficiently when the coloring layer 266 is not provided; therefore, luminance can be improved or power consumption can be reduced, for example.

On the other hand, when the light-blocking layer 264, the coloring layer 266, and the overcoat layer 268 are provided, reflection of external light is inhibited and thus a contrast ratio, color reproducibility, or the like can be improved.

Note that in the case where the light-emitting device 100 has a bottom-emission structure, the light-blocking layer 264, the coloring layer 266, and the overcoat layer 268 may be provided on the substrate 111 side. In the case where the light-emitting device 100 has a dual-emission structure, the light-blocking layer 264, the coloring layer 266, and the overcoat layer 268 may be provided on either or both of the substrate 111 side and the substrate 121 side.

A switching element having a function of supplying a signal to the light-emitting element 125 may be provided between the light-emitting element 125 and the terminal electrode 116. For example, a transistor may be provided between the light-emitting element 125 and the terminal electrode 116.

A transistor is a kind of semiconductor element and enables amplification of current or voltage, switching operation for controlling conduction or non-conduction, or the like. By providing a transistor between the light-emitting element 125 and the electrode 116, an increase in the area of the display region 131 and a higher-resolution display can be achieved easily. Note that a resistor, an inductor, a capacitor, a rectifier element, or the like, without limitation to a switching element such as a transistor, can be provided in the display region 131.

[Substrates 111 and 121]

An organic resin material, a glass material that is thin enough to have flexibility, or the like can be used for the substrate 111 and the substrate 121. In the case where the light-emitting device 100 has a bottom-emission structure or a dual-emission structure, a material having a light-transmitting property with respect to light emitted from the EL layer 117 is used for the substrate 111. In the case where the light-emitting device 100 has a top-emission structure or a dual-emission structure, a material that transmits light emitted from the EL layer 117 is used for the substrate 121.

As a material that has flexibility and transmits visible light, which can be used for the substrate 111 and the substrate 121, the following can be used: a poly(ethylene terephthalate) resin, a poly(ethylene naphthalate) resin, a poly(ether sulfone) resin, a polyacrylonitrile resin, an acrylic resin, a polyimide resin, a polycarbonate resin, a polyamide resin, a polycycloolefin resin, a polystyrene resin, a poly(amide imide) resin, a polypropylene resin, a polyester resin, a poly(vinyl halide) resin, polytetrafluoroethylene, an epoxy resin, or the like. Alternatively, a mixture or a stack including any of these materials may be used. Note that the same material or different materials may be used for the substrate 111 and the substrate 121.

The thermal expansion coefficients of the substrate 121 and the substrate 111 are preferably less than or equal to 30 ppm/K and further preferably less than or equal to 10 ppm/K. On surfaces of the substrate 121 and the substrate 111, a protective film having low water permeability may be formed; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the substrate 121 and the substrate 111.

[Insulating Layer 119]

The insulating layer 119 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 119 may have, for example, a two-layer structure of silicon oxide and silicon nitride or a five-layer structure in which materials selected from the above are combined. The insulating layer 119 can be formed by a sputtering method, a CVD method, a thermal oxidation method, a coating method, a printing method, or the like.

The insulating layer 119 can prevent or reduce diffusion of an impurity element from the substrate 111, the bonding layer 112, or the like to the light-emitting element 125.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

[Terminal Electrode 116]

The terminal electrode 116 can be formed using a conductive material. For example, a metal element selected from aluminum, chromium, copper, silver, gold, platinum, tantalum, nickel, titanium, molybdenum, tungsten, hafnium, vanadium, niobium, manganese, magnesium, zirconium, beryllium, and the like; an alloy containing any of the above metal elements; an alloy containing a combination of the above metal elements; or the like can be used. A semiconductor typified by polycrystalline silicon containing an impurity element such as phosphorus, or silicide such as nickel silicide may also be used. There is no particular limitation on the formation method of the conductive material, and a variety of formation methods such as an evaporation method, a CVD method, a sputtering method, and a spin coating method can be employed.

The terminal electrode 116 can also be formed using a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, a conductive material containing nitrogen, such as titanium nitride, tantalum nitride, or tungsten nitride, can be used. It is also possible to use a stacked-layer structure formed using the above conductive material containing oxygen and a material containing the above metal element.

The terminal electrode 116 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure in which a titanium layer, an aluminum layer, and a titanium layer are stacked in this order are given. Alternatively, an alloy containing aluminum and one or more elements selected from titanium, tantalum, tungsten, molybdenum, chromium, neodymium, and scandium may be used as the terminal electrode 116.

[Insulating Layer 141]

The insulating layer 141 can be formed using a material and a method that are similar to those of the insulating layer 119.

[Electrode 115]

The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an indium tin oxide layer, and a layer having high reflectance (e.g., aluminum, an alloy containing aluminum, or silver) may be provided in contact with the layer.

The light-emitting device having a top-emission structure is described as an example in this embodiment. In the case of a light-emitting device having a bottom-emission structure or a dual emission structure, the electrode 115 may be formed using a light-transmitting conductive material.

[Partition 114]

The partition 114 has a function of preventing an electrical short circuit between the adjacent electrodes 118. In the case of using a metal mask for formation of the EL layer 117 described later, the partition 114 has a function of preventing the contact of metal mask with a region where the light-emitting element 125 is formed. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[EL Layer 117]

A structure of the EL layer 117 is described in Embodiment 4.

[Electrode 118]

The electrode 118 is used as a cathode in this embodiment, and thus the electrode 118 is preferably formed using a material that has a low work function and can inject electrons into the EL layer 117 described later. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used as the electrode 118. As the buffer layer, an oxide of an alkaline earth metal, a halide, a magnesium-silver, or the like can also be used.

In the case where light emitted from the EL layer 117 is extracted through the electrode 118, the electrode 118 preferably has a property of transmitting visible light.

[Bonding Layers 120, 112, and 122]

A light curable adhesive, a reaction curable adhesive, a thermosetting adhesive, or an anaerobic adhesive can be used as the bonding layer 120, the bonding layer 112, and the bonding layer 122. For example, an epoxy resin, an acrylic resin, or an imide resin can be used. A drying agent (e.g., zeolite) having a size less than or equal to the wavelength of light emitted from the EL layer 117 or a filler (e.g., titanium oxide or zirconium) with a high refractive index is preferably mixed into the bonding layer 120 in the case of a top-emission structure or into the bonding layer 112 in the case of a bottom-emission structure, in which case the light-coupling efficiency of extracting light emitted from the EL layer 117 negligibly decrease and the reliability of the light-emitting device is improved.

[Anisotropic Conductive Connection Layer 123]

The anisotropic conductive connection layer 123 can be formed using any of various kinds of anisotropic conductive films (ACF), anisotropic conductive pastes (ACP), and the like.

The anisotropic conductive connection layer 123 is formed by curing a paste-form or sheet-form material that is obtained by mixing conductive particles to a thermosetting resin or a thermosetting and light curable resin. The anisotropic conductive connection layer 123 exhibits an anisotropic conductive property by light irradiation or thermocompression bonding. As the conductive particles used for the anisotropic conductive connection layer 123, for example, particles of a spherical organic resin coated with a thin-film metal such as Au, Ni, or Co can be used.

[Insulating Layer 129]

The insulating layer 129 can be formed using a material and a method that are similar to those of the insulating layer 119.

[Reflective Layer 110]

The reflective layer 110 has a function of reflecting laser light. The reflective layer 110 is formed of a material with a reflectance of preferably as high as 30% or more and further preferably as high as 70% or more with respect to the irradiation light. In removing a film in the path of laser light emitted toward the reflective layer 110, a reflection component of the laser light can be utilized in some cases because of a high reflectance of the reflective layer 110. It is also preferable that the reflective layer 110 be formed of a material having an excellent heat resistance property so that it does not change with heat.

The reflective layer 110 can be formed with a single-layer structure or a stacked-layer structure of any of a layer including a metal, a layer including an alloy, a layer including a metal nitride, a layer including a metal oxide, a layer including a metal fluoride, a layer including a semiconductor, and a layer including an insulator.

Specific examples of the metal and alloy include a material containing any element selected from aluminum, copper, silver, chromium, tantalum, titanium, molybdenum, and tungsten.

The alloy containing aluminum has high reflectance. As the alloy containing aluminum, aluminum containing nickel, aluminum containing lanthanum and nickel, aluminum containing silicon, or the like can be used.

Specific examples of the metal nitride include titanium nitride, aluminum nitride, molybdenum nitride, tungsten nitride, and the like.

Specific examples of the metal fluoride include titanium fluoride, magnesium fluoride, lanthanum fluoride, aluminum fluoride, and the like.

As a stack applicable to the reflective layer 110, a structure in which a high-melting-point metal or the metal nitride is stacked on the lower side and/or the upper side of the reflective layer 110 can be used. Note that specific examples of the high-melting-point metal include chromium, tantalum, titanium, molybdenum, tungsten, neodymium, scandium, yttrium, and the like.

Moreover, as the reflective layer 110, a dielectric multilayer film in which a thin film with a high refractive index and a thin film with a low refractive index are alternately stacked may be used. The use of the dielectric multilayer film provides a reflective layer with a high reflectance and small absorption. Examples of a material that can form the dielectric multilayer film include silicon oxide, a metal oxide such as titanium oxide, or the like, in addition to the above fluoride.

As the semiconductor material, for example, a metal silicide or a conductive metal oxide can be used. Specific examples of the conductive metal oxide include indium oxide, tin oxide, indium tin oxide (ITO), indium zinc oxide, zinc oxide, zinc oxide to which gallium or aluminum is added, and any of the metal oxides which contain silicon oxide.

As the insulator, one insulator selected from silicon oxide, silicon oxynitride, aluminum oxide, an acrylic resin, a polyimide resin, a benzocyclobutene resin, a polyamide resin, an epoxy resin, a siloxane-based resin, an SOG, or a polysilazane-based SOG, or an insulator including any one of these can be used.

The reflective layer 110 preferably has a thickness at which the irradiation light is not transmitted so that a film behind the reflective layer 110 is not damaged by the laser light in a path thereof. Note that when the thickness of the reflective layer 110 is too large, it takes long time to form or process the film; thus, the thickness is preferably greater than or equal to 30 nm and less than or equal to 2 μm and further preferably greater than or equal to 100 nm and less than or equal to 1 μm, although it depends on the material.

[Example of Manufacturing Method of Light-Emitting Device]

Next, an example of a method for manufacturing the light-emitting device 100 of one embodiment of the present invention, to which the external electrode is connected, is described with reference to FIGS. 8A to 8E, FIGS. 9A to 9D, FIGS. 10A to 10F, FIGS. 11A to 11C, FIGS. 12A and 12B, FIGS. 13A and 13B, FIGS. 14A and 14B, and FIGS. 15A to 15D. FIGS. 8A to 15D except FIGS. 11A to 11C correspond to the cross-sectionals taken along the dashed-dotted line A1-A2 in FIGS. 4A to 6B.

[Formation of Peeling Layer 113]

First, a peeling layer 113 is formed over a support substrate 101. As the support substrate 101, for example, a glass substrate, a quartz substrate, a sapphire substrate, a ceramic substrate, a metal substrate, or a semiconductor substrate, or the like can be used. Alternatively, a substrate having sufficient heat resistance to the processing temperature of this embodiment may be used. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, and the like. As an example of a glass substrate, a barium borosilicate glass substrate, an alumino-borosilicate glass substrate, and soda lime glass substrate can be given.

The peeling layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The peeling layer 113 can also be formed to have a single-layer structure or a stacked-layer structure using any of the materials. Note that the crystalline structure of the peeling layer 113 may be amorphous, microcrystalline, or polycrystalline. The peeling layer 113 can also be formed using a metal oxide such as aluminum oxide, gallium oxide, zinc oxide, titanium dioxide, indium oxide, indium tin oxide, indium zinc oxide, or an oxide including indium, gallium, and zinc (In—Ga—Zn—O, IGZO).

The peeling layer 113 can be formed by a sputtering method, a CVD method, a coating method, a printing method, or the like. Note that the coating method includes a spin coating method, a droplet discharge method, and a dispensing method.

In the case where the peeling layer 113 has a single-layer structure, tungsten, molybdenum, or a material containing tungsten and molybdenum is preferably used, or an oxide or oxynitride of tungsten, an oxide or oxynitride of molybdenum, or an oxide or oxynitride of a material containing tungsten and molybdenum is preferably used.

Note that after the formation of the peeling layer 113, the surface of the peeling layer 113 may be exposed to an atmosphere containing oxygen or a plasma atmosphere containing oxygen. Oxidizing the surface of the peeling layer 113 can facilitate peeling of the support substrate 101 performed later.

A glass substrate is used as the support substrate 101 in this embodiment. The peeling layer 113 is formed of tungsten over the support substrate 101 by a sputtering method.

[Formation of Insulating Layer 119]

Subsequently, the insulating layer 119 is formed over the peeling layer 113.

For the insulating layer 119, an inorganic insulating material such as silicon oxide, silicon oxynitride, silicon nitride oxide, silicon nitride, or aluminum oxide can be used. The insulating layer 119 can be a single layer or stacked layers containing the above inorganic insulating material.

In particular, it is preferable that the insulating layer 119 have a stacked-layer structure including two or more layers. In the stacked structure, at least one of the layers is preferably a layer that releases hydrogen when heated, and the closest layer to the peeling layer 113 is preferably a layer that transmits hydrogen. For example, the peeling layer 113 has a stacked-layer structure including a layer containing silicon oxynitride and a layer containing silicon nitride in this order from the peeling layer 113 side. In this embodiment, the insulating layer 119 is formed by stacking a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film by a plasma CVD method from the support substrate 101 side.

The insulating layer 119 can be formed by a sputtering method, a plasma CVD method, or the like. In particular, the insulating layer 119 is preferably formed by a plasma CVD method using a deposition gas containing hydrogen.

A surface of the peeling layer 113 is oxidized when the insulating layer 119 is formed, and as a result, an oxide layer is formed between the peeling layer 113 and the insulating layer 119. The oxide layer contains an oxide of the metal contained in the peeling layer 113. The oxide layer preferably contains tungsten oxide.

Tungsten oxide is generally represented by $WO_{(3-x)}$ and is a non-stoichiometric compound which can have a variety of compositions, typically $WO_3$, $W_2O_5$, $W_4O_{11}$, and $WO_2$.

Titanium oxide $TiO_{(2-x)}$ and molybdenum oxide $MoO_{(3-x)}$ are also non-stoichiometric compounds.

The oxide layer at this stage preferably contains a large amount of oxygen. For example, in the case where tungsten is used for the peeling layer 113, the oxide layer is preferably a tungsten oxide layer containing $WO_3$ as its main component.

The oxide layer can also be formed on the surface of peeling layer 113 in advance by performing plasma treatment on the surface of the peeling layer 113 in an atmosphere containing an oxidized gas (preferably a dinitrogen monoxide gas) before the formation of the insulating layer 119. When such a method is employed, the thickness of the oxide layer can vary depending on the conditions for the plasma treatment and the thickness of the oxide layer can be controlled more effectively than in the case where plasma treatment is not performed.

The thickness of the oxide layer is, for example, greater than or equal to 0.1 nm and less than or equal to 100 nm, preferably greater than or equal to 0.5 nm and less than or equal to 20 nm. Note that the oxide layer with an extremely small thickness cannot be observed in a cross-sectional image in some cases.

[Heat Treatment]

Next, heat treatment is performed to change the quality of the oxide layer. By the heat treatment, hydrogen is released from the insulating layer 119 to the oxide layer.

The metal oxide in the oxide layer is reduced by hydrogen supplied to the oxide layer, so that a plurality of regions with different proportions of oxygen are mixed in the oxide layer. For example, in the case where tungsten is used for the peeling layer 113, $WO_3$ in the oxide layer is reduced to generate an oxide with a proportion of oxygen lower than that of $WO_3$ (e.g., $WO_2$), resulting in a state where $WO_3$ and the oxide with the lower proportion of oxygen are mixed. The crystal structure of such a metal oxide depends on the proportion of oxygen; thus, when a plurality of regions with different proportions of oxygen is provided in the oxide layer, the mechanical strength of the oxide layer is reduced. As a result, the oxide layer is likely to be damaged inside, so that the peelability in a later peeling step can be improved.

The heat treatment may be performed at a temperature higher than or equal to the temperature at which hydrogen is released from the insulating layer 119 and lower than or equal to the temperature at which the support substrate 101 is softened. Furthermore, the heat treatment is preferably performed at a temperature higher than or equal to the temperature at which a reduction reaction between hydrogen and the metal oxide in the oxide layer occurs. For example, in the case where tungsten is used for the peeling layer 113, the heating temperature is higher than or equal to 420° C., higher than or equal to 450° C., higher than or equal to 600° C., or higher than or equal to 650° C.

The higher the temperature of the heat treatment is, the more the amount of hydrogen released from the insulating layer 119 increases, leading to improved peelability. However, even when the heating temperature is reduced in consideration of the heat resistance of the support substrate 101 and the productivity, high peelability can be achieved by forming the oxide layer in advance by performing plasma treatment on the peeling layer 113 as described above.

[Formation of Terminal Electrode 116]

Next, a conductive layer 126 for forming the terminal electrode 116 is formed over the insulating layer 119. In this embodiment, as the conductive layer 126, a three-layer metal film in which a layer of aluminum is provided between two layers of titanium is formed over the insulating layer 119 by a sputtering method (see FIG. 8A).

After that, a resist mask is formed over the conductive layer 126, and the conductive layer 126 is etched into a desired shape using the resist mask, so that the terminal electrode 116 can be formed. The resist mask can be formed by a lithography method, a printing method, an inkjet method, or the like as appropriate. Formation of the resist mask by an inkjet method needs no photomask; thus, manufacturing cost can be reduced.

The etching of the conductive layer 126 may be performed by a dry etching method, a wet etching method, or both of them. In the case where the conductive layers 126 is etched by a wet etching method, a solution obtained by mixing phosphoric acid, acetic acid, and nitric acid, a solution containing oxalic acid, a solution containing phosphoric acid, or the like can be used as an etchant. After the etching treatment, the resist mask is removed (see FIG. 8B).

[Formation of Insulating Layer 127]

Figure 8A:
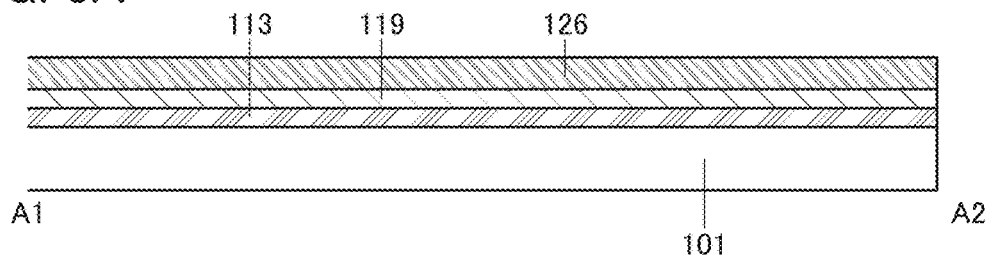
FIGS. 8A to 8E illustrate a method for manufacturing a light-emitting device of an embodiment.
Figure 8B:
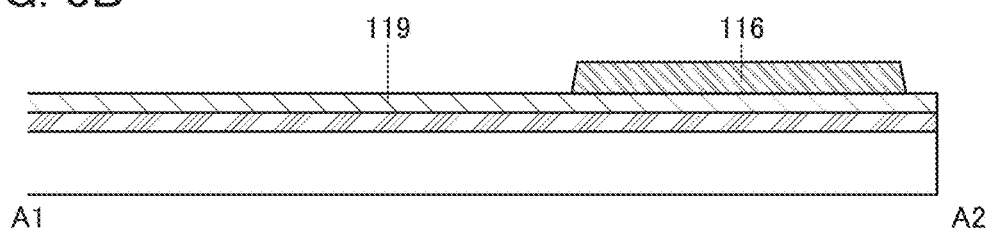
Figure 8C:
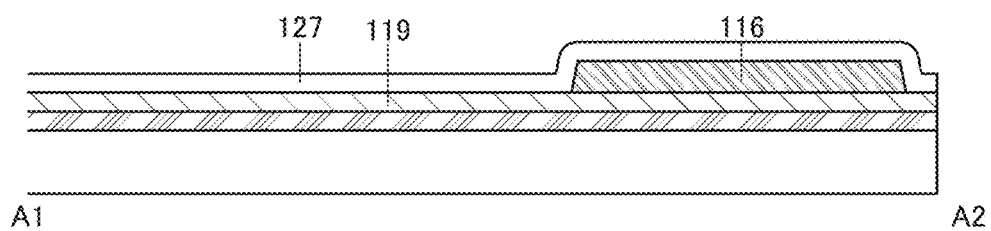

Next, an insulating layer 127 is formed over the terminal electrode 116 (see FIG. 8C). In this embodiment, a silicon oxynitride film is formed by a plasma CVD method as the insulating layer 127.

Figure 8D:
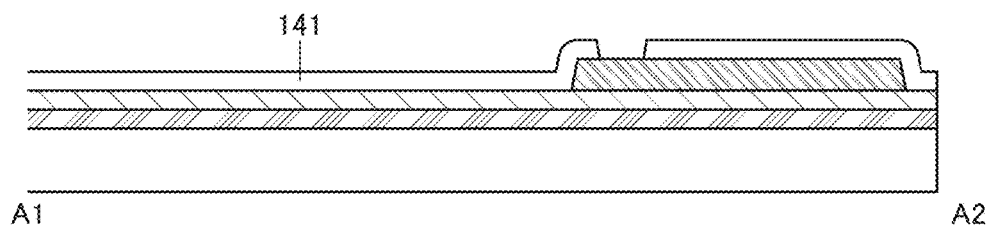

Next, a resist mask is formed over the insulating layer 127, and part of the insulating layer 127 overlapping with the terminal electrode 116 is selectively removed using the resist mask, so that the insulating layer 141 having an opening is formed (see FIG. 8D). The etching of the insulating layer 127 may be performed by a dry etching method, a wet etching method, or both of them.

[Formation of Electrode 115]

Figure 8E:
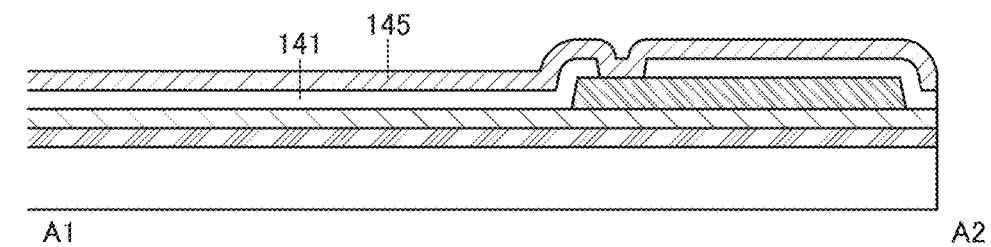

Next, a conductive layer 145 for forming the electrode 115 is formed over the insulating layer 141 (see FIG. 8E). The conductive layer 145 can be formed using a material and a method that are similar to those of the conductive layer 126.

Figure 9A:
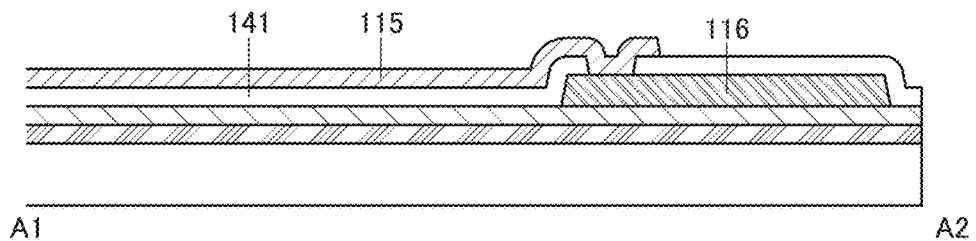
FIGS. 9A to 9D illustrate a method for manufacturing a light-emitting device of an embodiment.

Next, a resist mask is formed over the conductive layer 145, and part of the conductive layer 145 is selectively removed using the resist mask, so that the electrode 115 is formed (see FIG. 9A). The etching of the conductive layer 145 may be performed by a dry etching method, a wet etching method, or both of them. In this embodiment, the conductive layer 145 (electrode 115) is formed using a material in which indium tin oxide is stacked over silver. The electrode 115 and the terminal electrode 116 are electrically connected to each other through the opening provided in the insulating layer 127.

[Formation of Partition 114]

Figure 9B:
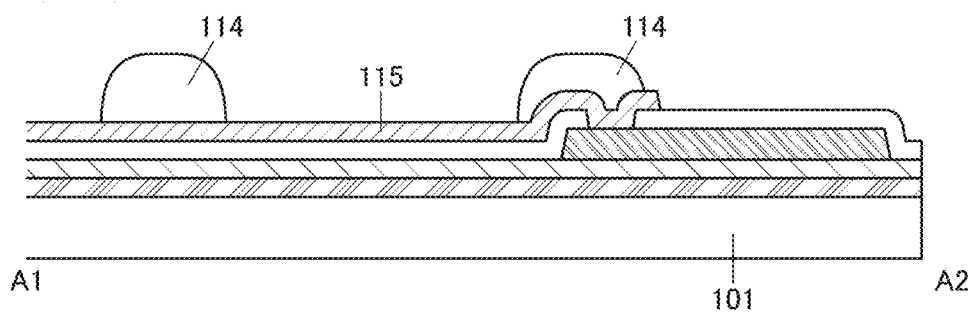

Next, the partition 114 is formed (see FIG. 9B). In this embodiment, the partition 114 is formed in such a manner that a photosensitive organic resin material is applied by a coating method and processed into a desired shape. In this embodiment, the partition 114 is formed using a photosensitive polyimide resin.

[Formation of EL Layer 117]

Figure 9C:
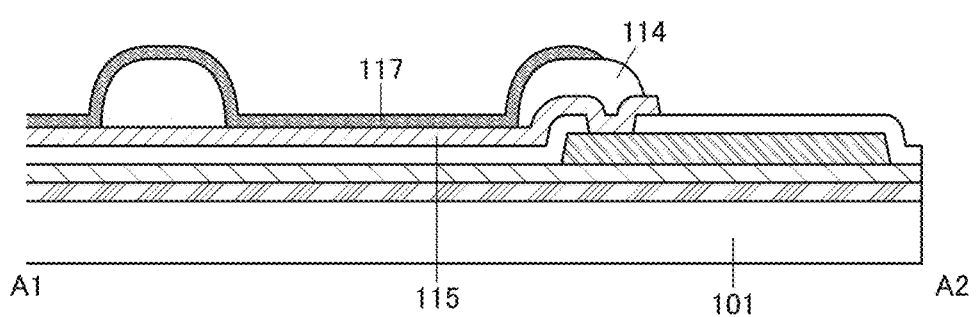

Next, the EL layer 117 is formed over the electrode 115 and the partition 114 (see FIG. 9C).

[Formation of Electrode 118]

Figure 9D:
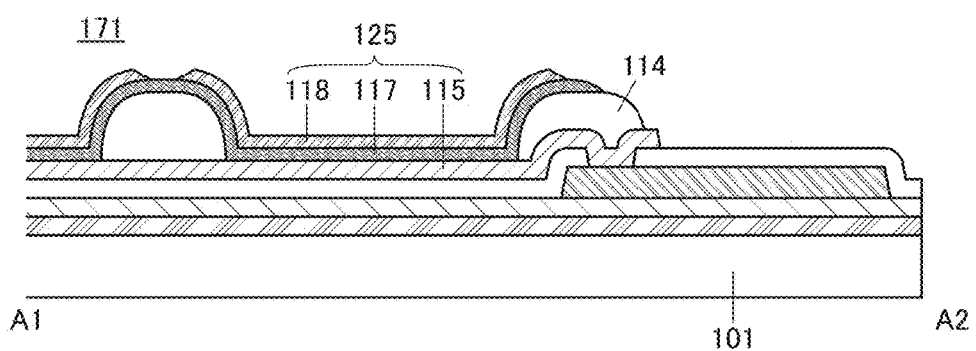

Next, the electrode 118 is formed over the EL layer 117 (see FIG. 9D). The electrode 118 can be formed by an evaporation method, a sputtering method, or the like. In this embodiment, an alloy of silver and magnesium is used for the electrode 118.

In this embodiment, the support substrate 101 over which the light-emitting element 125 is formed is referred to as an element substrate 171.

Next, a method for manufacturing a counter substrate 181 is described.

[Formation of Peeling Layer 143]

Figure 10A:
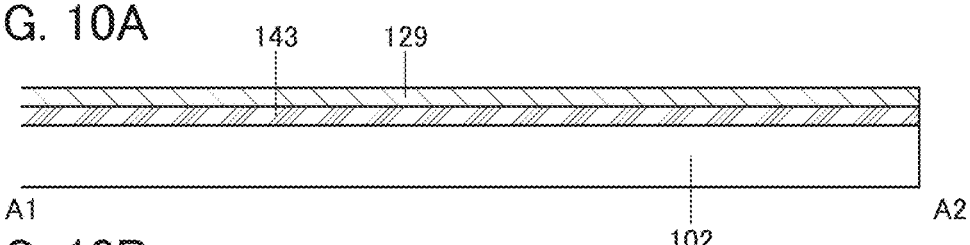
FIGS. 10A to 10F illustrate a method for manufacturing a light-emitting device of an embodiment.

First, a peeling layer 143 is formed over a support substrate 102 (see FIG. 10A). The support substrate 102 can be formed using a material similar to that of the support substrate 101. Note that the same material or different materials may be used for the support substrate 101 and the support substrate 102. The peeling layer 143 can be formed in a manner similar to that of the peeling layer 113. Moreover, an insulating layer may be provided between the support substrate 102 and the peeling layer 143. In this embodiment, a glass substrate is used as the support substrate 102. The peeling layer 143 is formed of tungsten over the support substrate 102 by a sputtering method.

Note that after the formation of the peeling layer 143, the surface of the peeling layer 143 may be exposed to an atmosphere containing oxygen or a plasma atmosphere containing oxygen. Oxidizing the surface of the peeling layer 143 can facilitate peeling of the support substrate 102 performed later.

[Formation of Insulating Layer 129]

Next, the insulating layer 129 is formed over the peeling layer 143 (see FIG. 10A). The insulating layer 129 can be formed using a material and a method that are similar to those of the insulating layer 119. Heat treatment similar to that performed after the formation of the insulating layer 119 may be performed after the insulating layer 129 is formed.

The heat treatment after the formation of the insulating layer 129 may be performed under different conditions (treatment temperature and time) from those of the heat treatment after the formation of the insulating layer 119. When the support substrate 101 and the support substrate 102 have different peelability, which will be described later, the yield in the steps of peeling the substrates can be improved. This is because, when the peelability of the support substrate 101 is different from that of the support substrate 102 and the substrate having high peelability is peeled first, start of peeling of the other substrate can be inhibited easily while one of the substrates is peeled.

While the support substrate 101 is peeled first, concurrent peeling of the support substrate 102 can be inhibited in such a manner that, for example, the heat treatment after the formation of the insulating layer 129 is performed at a lower temperature and/or in a shorter time than the heat treatment after the formation of the insulating layer 119. Furthermore, while the support substrate 101 is peeled first, concurrent peeling of the support substrate 102 can be inhibited in such a manner that, after the formation of the peeling layer 113, the surface of the peeling layer 113 is exposed to an atmosphere containing oxygen or a plasma atmosphere containing oxygen, and the surface of the peeling layer 143 is exposed to the same atmosphere in a shorter time or not after its formation.

In this embodiment, the insulating layer 129 is formed by stacking a 200-nm-thick silicon oxynitride film, a 140-nm-thick silicon nitride oxide film, and a 100-nm-thick silicon oxynitride film by a plasma CVD method from the support substrate 102 side.

[Formation of Reflective Layer 110]

Figure 10B:
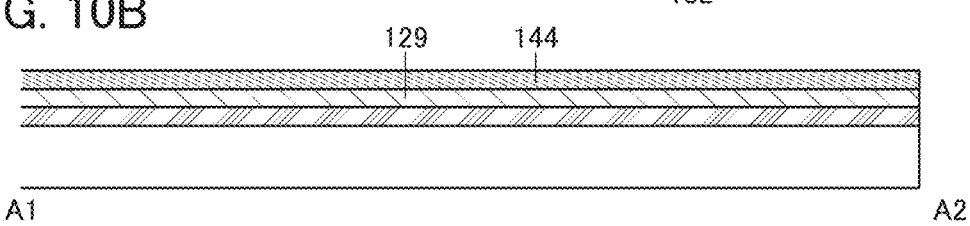
Figure 10C:
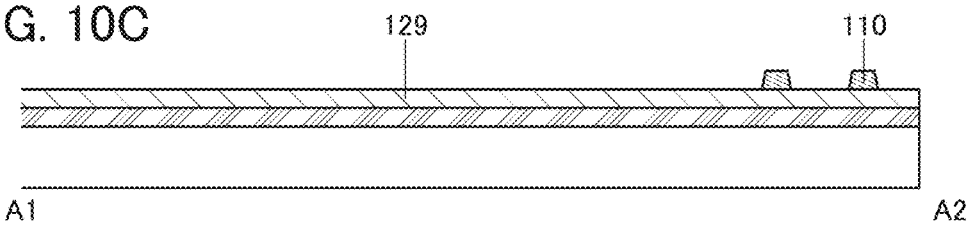

Next, a layer 144 for forming the reflective layer 110 is formed over the insulating layer 129 (see FIG. 10B). The layer 144 may have a single-layer structure or a stacked-layer structure including two or more layers. In this embodiment, a stack in which a 600-nm-thick aluminum layer is provided between a 100-nm-thick titanium layer and a 200-nm-thick titanium layer is formed as the layer 144 by a sputtering method. After that, a resist mask is formed over the layer 144, and the layer 144 is etched into a desired shape using the resist mask, so that the reflective layer 110 can be formed (see FIG. 10C).

[Formation of Light-Blocking Layer 264]

Next, a layer for forming the light-blocking layer 264 is formed over the insulating layer 129. The layer may have a single-layer structure or a stacked-layer structure including two or more layers. Examples of a material for the layer are a metal material including chromium, titanium, nickel, or the like; and an oxide material including chromium, titanium, nickel, or the like.

Figure 10D:
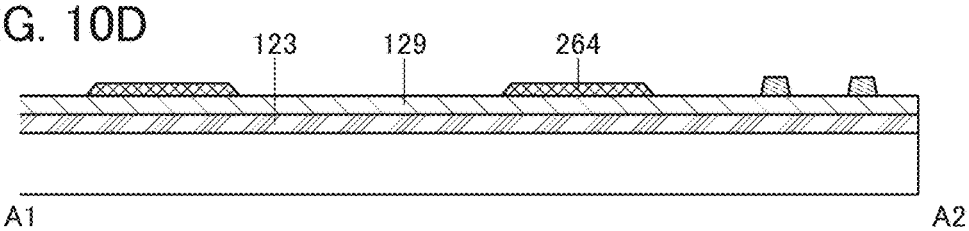

In the case where the layer is formed using the metal material or the oxide material, a resist mask is formed over the layer, and the layer is etched into a desired shape using the resist mask, so that the light-blocking layer 264 can be formed (see FIG. 10D). With a macromolecular material in which carbon black is dispersed, direct writing of the light-blocking layer 264 can be performed over the insulating layer 129 by an inkjet method.

The light-blocking layer 264 may be formed in the same step as the reflective layer 110 using a material similar thereto. By the formation of the reflective layer 110 and the light-blocking layer 264 in the same step, the number of manufacturing steps of the counter substrate 181 can be reduced.

[Formation of Coloring Layer 266]

Figure 10E:
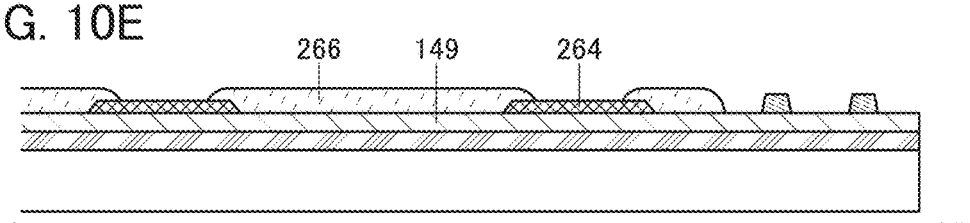

Next, the coloring layer 266 is formed over the insulating layer 129 (see FIG. 10E). Each coloring layer 266 is formed in a desired position with any of various materials by a printing method, an inkjet method, or a photolithography method. At this time, the coloring layer 266 is preferably provided so as to partly overlap with the light-blocking layer 264. Color display can be performed by providing the coloring layers 266 of different colors in different pixels.

Figure 11A:
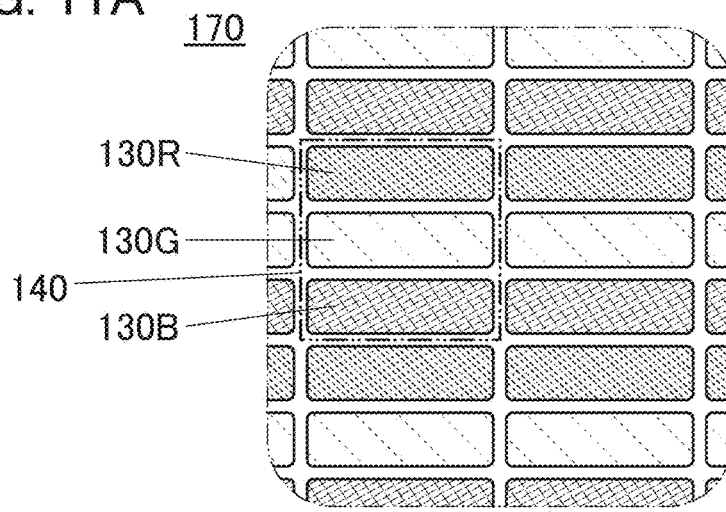
FIGS. 11A to 11C each illustrate a structure example of a light-emitting device of an embodiment.
Figure 11B:
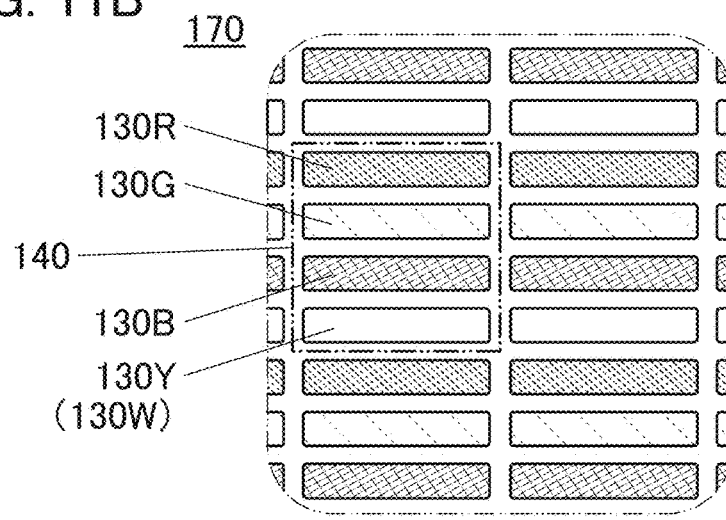
Figure 11C:
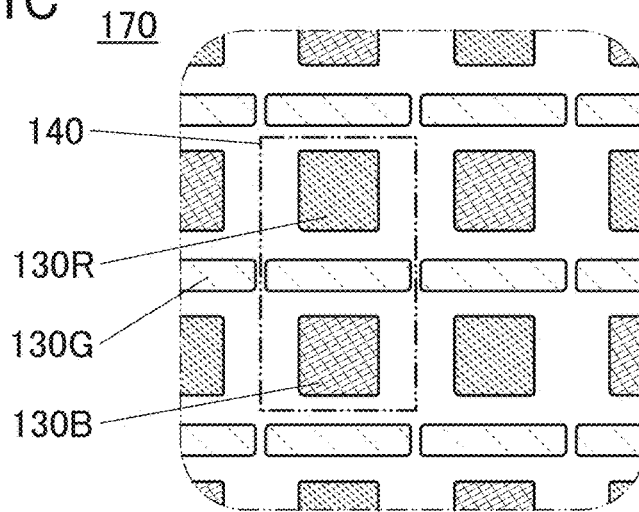

Here, examples of a pixel configuration for achieving color display are described with reference to FIGS. 11A to 11C. FIGS. 11A to 11C are enlarged plan views of a region 170 in the display region 131 of FIG. 4A. For example, as illustrated in FIG. 11A, full color display can be achieved in such a manner that the red, green, and blue coloring layers 266 are used so as to correspond to three pixels 130 which serves as one pixel 140. In FIG. 11A, the pixel 130 emitting red light, the pixel 130 emitting green light, and the pixel 130 emitting blue light are illustrated as a pixel 130R, a pixel 130G, and a pixel 130B, respectively. The colors of the coloring layers 266 may be a color other than red, green, and blue; for example, the coloring layer 266 may be yellow, cyan, magenta, or the like.

As illustrated in FIG. 11B, four pixels 130 may function as a subpixel and may be collectively used as one pixel 140. For example, the coloring layers 266 corresponding to the four pixels 130 may be red, green, blue, and yellow. In FIG. 11B, the pixel 130 emitting red light, the pixel 130 emitting green light, the pixel 130 emitting blue light, and the pixel 130 emitting yellow light are illustrated as a pixel 130R, a pixel 130G, a pixel 130B, and a pixel 130Y, respectively. By increasing the number of pixels 130 used as one pixel 140, the color reproducibility can be particularly improved. Thus, the display quality of the light-emitting device can be improved.

Alternatively, the coloring layers 266 corresponding to the four pixels 130 may be red, green, blue, and white. With the pixel 130 emitting white light (a pixel 130W), the luminance of the display region can be increased. Note that in the case of the pixel 130 emitting white light, it is not necessary to provide the coloring layer 266. Without a white coloring layer 266, there is no luminance reduction at the time of transmitting light through the coloring layer 266; thus, power consumption of the light-emitting device can be reduced. On the other hand, color temperature of white light can be controlled with the white coloring layer 266. Thus, the display quality of the light-emitting device can be improved.

Note that the occupation areas or shapes of the pixels 130 may be the same or different. In addition, arrangement is not limited to stripe arrangement. For example, delta arrangement, Bayer arrangement, or pentile arrangement can be used. FIG. 11C illustrates an example of pentile arrangement.

[Formation of Overcoat Layer 268]

Figure 10F:
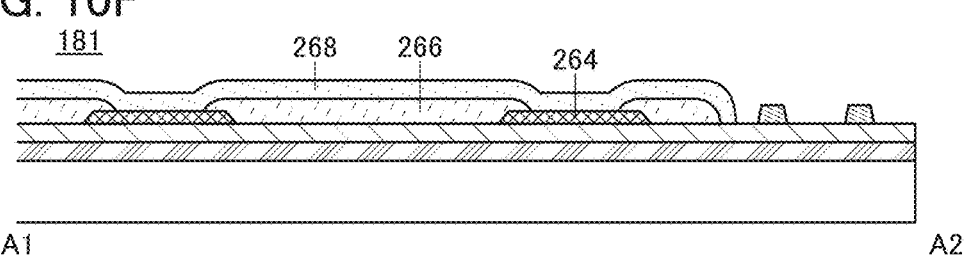

Next, the overcoat layer 268 is formed over the light-blocking layer 264 and the coloring layer 266 (see FIG. 10F).

For the overcoat layer 268, an organic insulating layer of an acrylic resin, an epoxy resin, a polyimide resin, or the like can be used. With the overcoat layer 268, diffusion of an impurity or the like contained in the coloring layer 266 to the light-emitting element 125 side can be inhibited, for example. Note that the overcoat layer 268 is not necessarily formed.

A light-transmitting conductive film may be formed as the overcoat layer 268, by which the light 151 emitted from the light-emitting element 125 can be transmitted through the overcoat layer 268 and transmission of ionized impurities through the overcoat layer 268 can be prevented.

The light-transmitting conductive film can be formed using, for example, indium oxide, indium tin oxide, indium zinc oxide, zinc oxide, or zinc oxide to which gallium is added. Graphene or a metal film that is thin enough to have a light-transmitting property can also be used.

In this embodiment, the support substrate 102 over which the coloring layer 266 and the like are formed is referred to as a counter substrate 181. Through the above steps, the counter substrate 181 can be formed. Note that in the case where the light-emitting device 100 in FIGS. 7A and 7B are manufactured, the steps of providing the light-blocking layer 264, the coloring layer 266, and the overcoat layer 268 on the substrate 181 are not performed.

[Attachment of Element Substrate 171 and Counter Substrate 181]

Next, the element substrate 171 and the counter substrate 181 are attached to each other with the bonding layer 120 provided therebetween. At the attachment, the light-emitting element 125 included in the element substrate 171 and the coloring layer 266 included in the counter substrate 181 are arranged so as to face each other (see FIG. 12A).

[Peeling of Support Substrate 101]

Figure 12A:
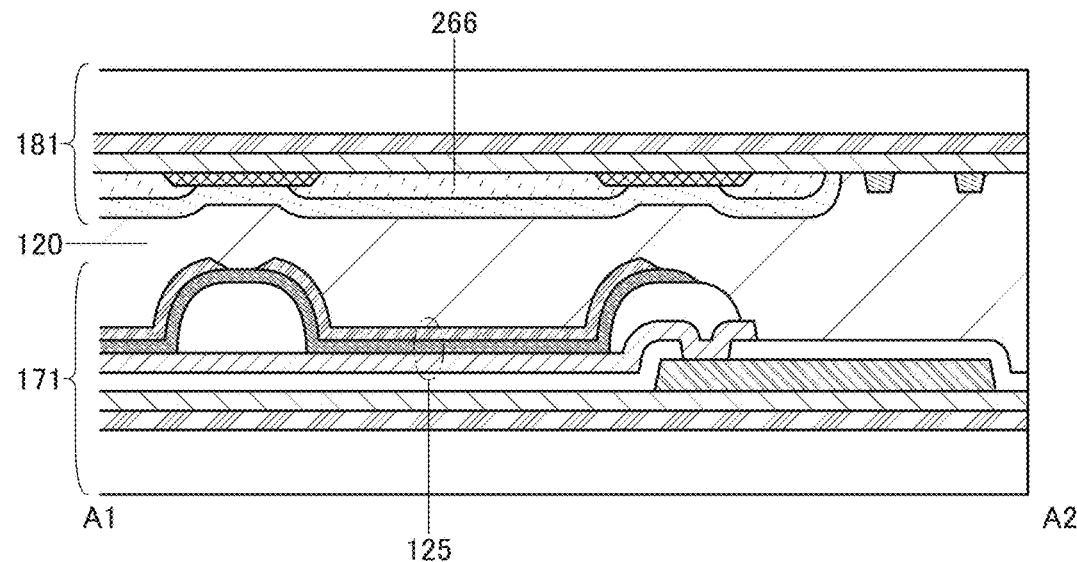
FIGS. 12A and 12B illustrate a method for manufacturing a light-emitting device of an embodiment.
Figure 12B:
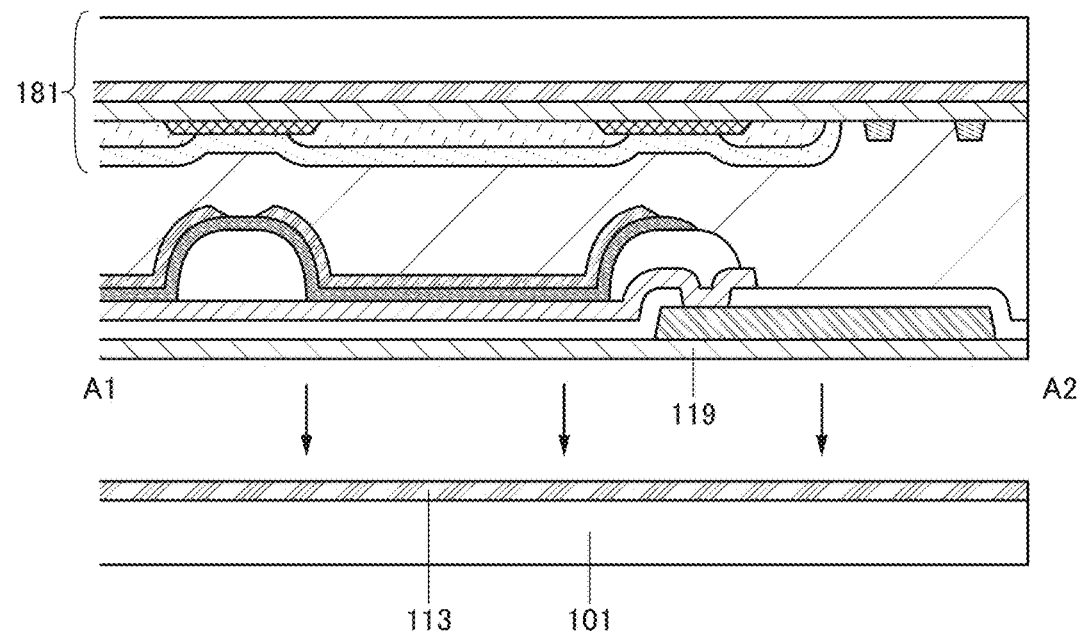

Next, the support substrate 101 included in the element substrate 171 is peeled from the insulating layer 119 together with the peeling layer 113 (see FIG. 12B). As a peeling method, mechanical force (a peeling process with a human hand or a gripper, a separation process by rotation of a roller, ultrasonic waves, or the like) may be used. For example, a cut is made in the interface between the peeling layer 113 and the insulating layer 119 from the side surface of the element substrate 171 with a sharp edged tool, by laser beam irradiation, or the like, and water is injected into the cut. The interface between the peeling layer 113 and the insulating layer 119 absorbs water by capillary action, so that the support substrate 101 can be peeled easily from the insulating layer 119 together with the peeling layer 113.

[Attachment of Substrate 111]

Figure 13A:
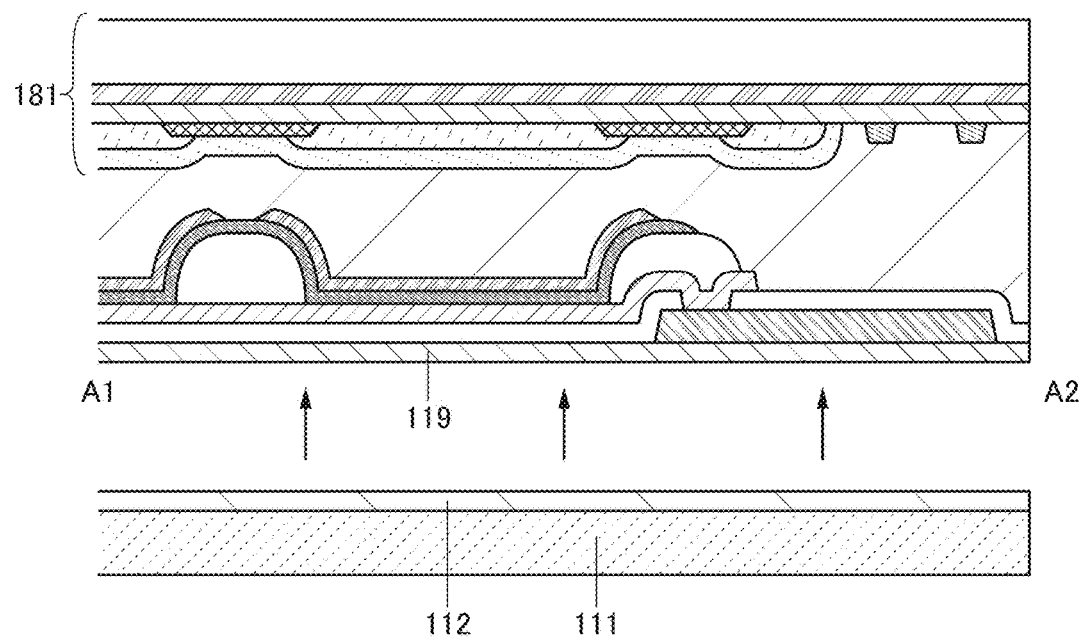
FIGS. 13A and 13B illustrate a method for manufacturing a light-emitting device of an embodiment.

Next, the substrate 111 is attached to the insulating layer 119 with the bonding layer 112 provided therebetween (see FIG. 13A).

[Peeling of Support Substrate 102]

Next, the support substrate 102 included in the counter substrate 181 is peeled from the insulating layer 129 together with the peeling layer 143. The support substrate 102 can be peeled using a peeling method similar to that of the support substrate 101. In the case where the peelability of the support substrate 101 is lower than that of the support substrate 102, the support substrate 102 is peeled first so that the yield in the steps of peeling the substrates can be improved.

[Attachment of Substrate 121]

Figure 13B:
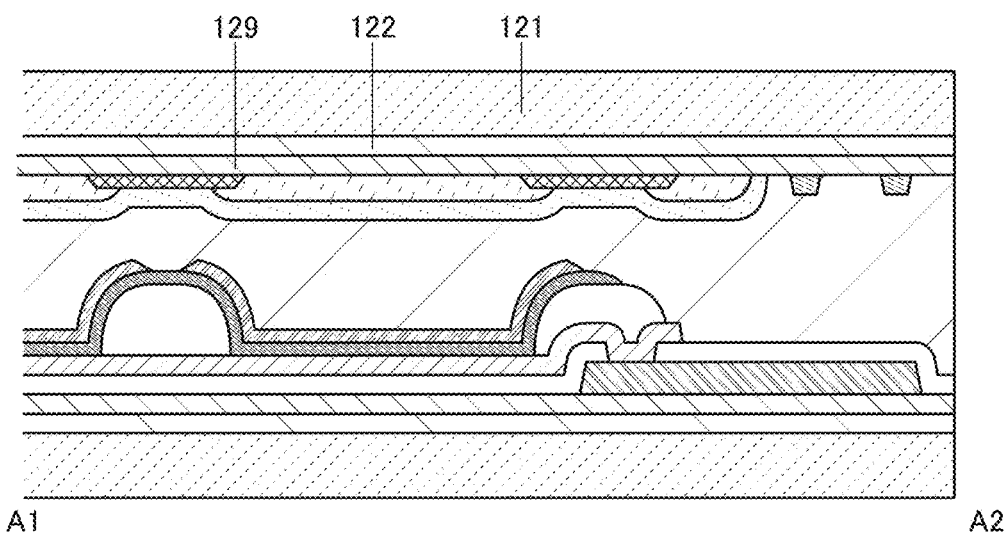

Next, the substrate 121 is attached to the insulating layer 129 with the bonding layer 122 provided therebetween (see FIG. 13B).

[Formation of Opening 132]

Figure 14A:
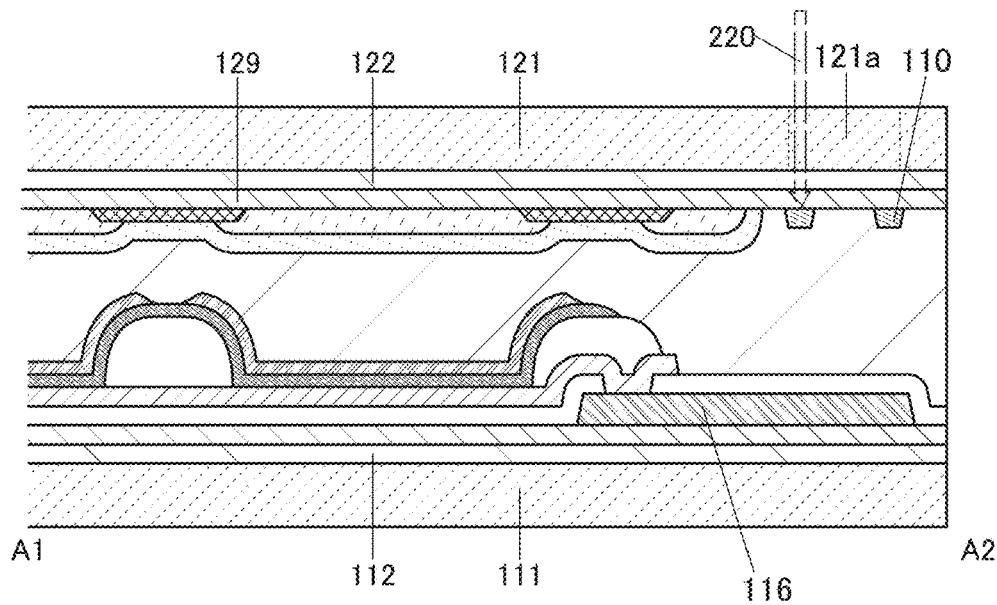
FIGS. 14A and 14B illustrate a method for manufacturing a light-emitting device of an embodiment.

Next, the reflective layer 110 is irradiated with the laser light 220 from the substrate 121 side (see FIG. 14A).

As the laser light 220, infrared light, visible light, or ultraviolet light emitted from a halogen lamp, a high pressure mercury lamp, or the like can be used. In addition, as the laser light 220, intense light such as continuous wave laser light or pulsed laser light can be used. In particular, the pulsed laser light is preferable because pulsed laser light with high energy can be emitted instantaneously. As a pulsed laser light, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser can be used, for example.

The wavelength of the laser light 220 is preferably 200 nm to 20 μm. For example, as the laser light 220, a $CO_2$ laser with the wavelength of 10.6 μm can be used. The $CO_2$ laser can process a film or a glass substrate made of an organic material or an inorganic material. In the case of the pulsed laser light used as the laser light 220, the pulse width is preferably 10 ps (picosecond) to 10 μs (microsecond), further preferably 10 ps to 1 μs, and still further preferably 10 ps to 1 ns (nanosecond). For example, pulsed laser light with the wavelength of 532 nm and the pulse width of 1 ns or less is used.

By the irradiation with the laser light 220, each part of the substrate 121, the bonding layer 122, and the insulating layer 129 in a path through which the laser light 220 reaches the reflective layer 110 can be removed. Accordingly, in a plan view, the layers (the bonding layer 122, the insulating layer 129, and the bonding layer 120) between part of the portion 121a in the substrate 121 and the terminal electrode 116 overlapping with the part can be separated easily.

Figure 15A:
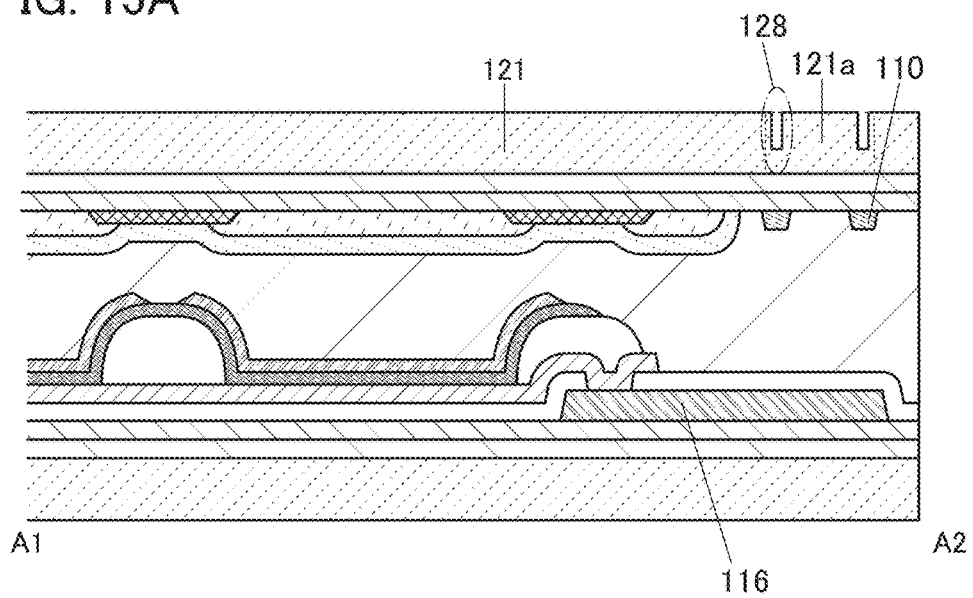
FIGS. 15A to 15D illustrate a method for manufacturing a light-emitting device of an embodiment.

Note that all of the films in the path are not necessarily removed by the irradiation with the laser light 220, and at least part of the substrate 121 needs to be removed as illustrated in FIG. 15A. In the case where a groove 128 formed in the substrate 121 by the irradiation with the laser light 220 does not penetrate the substrate 121, the depth of the groove 128 is preferably half or more and further preferably two thirds or more of the thickness of the substrate 121 (see FIG. 15A).

The reflective layer 110 may be damaged when being irradiated with the laser light 220. Specifically, the reflective layer 110 may be damaged such that the laser light 220 does not reach a layer lower than the reflective layer 110, in particular, the terminal electrode 116.

Figure 15B:
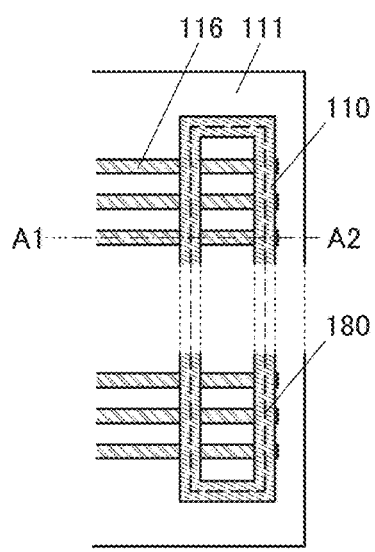
Figure 15C:
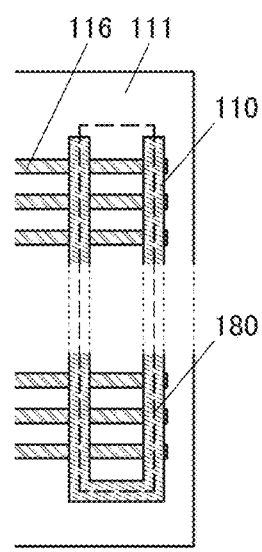
Figure 15D:
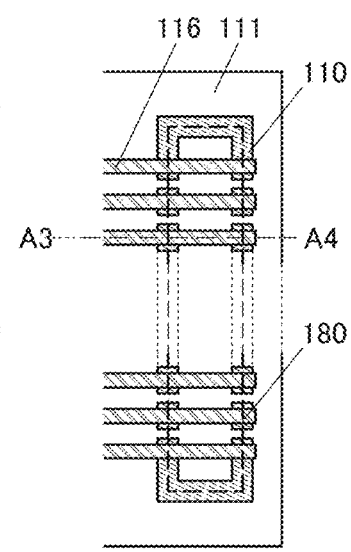

FIG. 15B is an enlarged top view of a peripheral portion of the reflective layer 110 in the light-emitting device 100 before the irradiation with the laser light 220. FIGS. 15C and 15D are modification examples of the same portion. Note that in FIGS. 15B to 15D, the components of the light-emitting device 100 except the substrate 111, the reflective layer 110, and the terminal electrode 116 are omitted.

As in FIG. 15B, the reflective layer 110 is irradiated with the laser light 220 along a locus 180 that forms a closed curve. Note that as in FIG. 15C, the light-emitting device 100 may have a structure with the divided reflective layer 110 at a position not overlapping with the terminal electrode 116. In this case also, the irradiation with the laser light 220 is preferably performed along the locus 180 that forms a closed curve. The portion 121a is surrounded by the groove formed in the substrate 121 without any space by the irradiation with the laser light 220 so that part of the substrate 121 on an outer side of the portion 121a can be prevented from being peeled concurrently with the separation of the portion 121a.

Figure 16A:
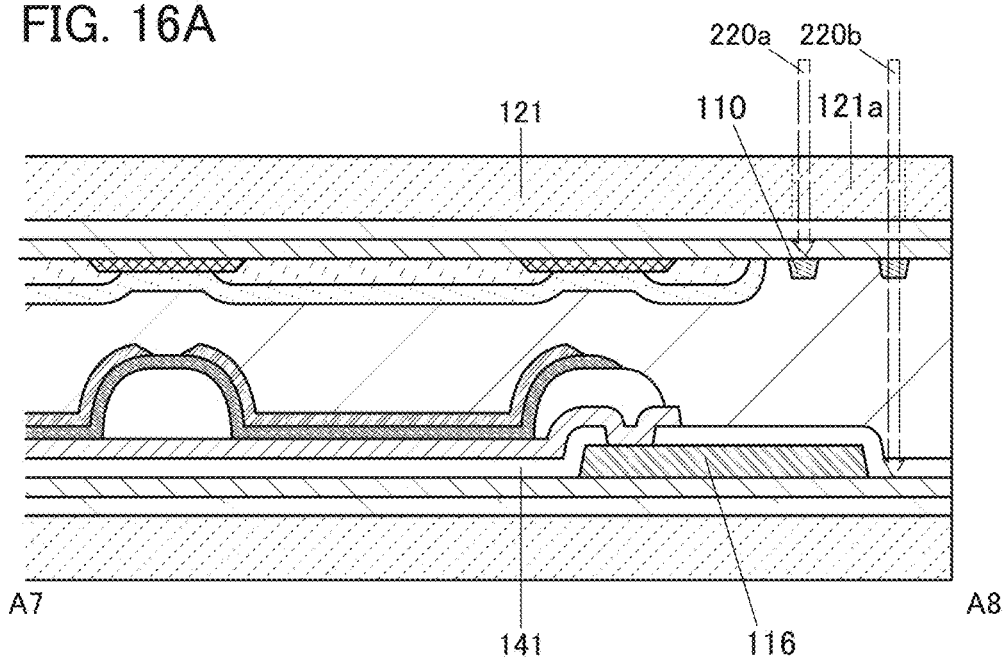
FIGS. 16A and 16B illustrate a method for manufacturing a light-emitting device of an embodiment.
Figure 16B:
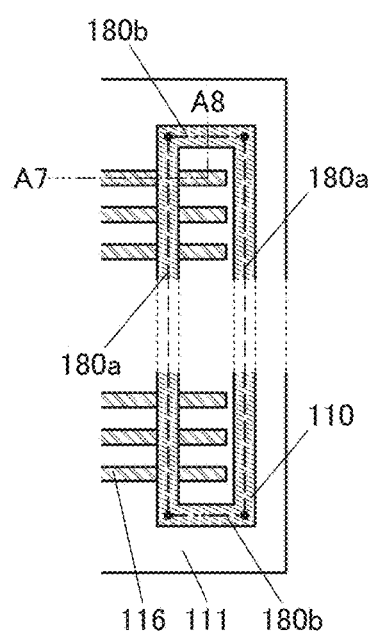

The number of times the laser irradiation is performed or intensity of the irradiation with the laser light emitted to the reflective layer 110 may be changed depending on an irradiation position. A cross-sectional view of the light-emitting device 100 illustrated in FIG. 16A is taken along line A7-A8 in FIG. 16B. The reflective layer 110 is irradiated with the laser light along a locus 180a (dashed line) and a locus 180b (dashed double-dotted line) illustrated in FIG. 16B. For example, a closed curve formed of the locus 180a and the locus 180b substantially accords with the locus 180 in FIG. 15B. The boundary between the locus 180a and the locus 180b is indicated by a black circle in FIG. 16B.

For example, the number of times the locus 180b is irradiated with laser light 220b is made larger than that of times the locus 180a is irradiated with laser light 220a. Alternatively, the intensity of the laser light 220b with which the locus 180b is irradiated made higher than that of the laser light 220a with which the locus 180a is irradiated. It is preferable that the irradiation with the laser light be performed in this manner so that the laser light can reach a deeper position than the reflective layer 110 at a position not overlapping with the terminal electrode 116 (a position overlapping with the locus 180b). The laser light 220b preferably reaches the vicinity of an interface between the bonding layer 120 and the insulating film 141. The laser light 220b further preferably reaches the EL layer 117 when the EL layer 117 and the electrode 118 are provided in a region overlapping with the portion 121a over the terminal electrode 116 and the insulating layer 119 in a plan view. In such a manner, the layers between the part of the portion 121a and the terminal electrode 116 overlapping with the part can be easily separated from the light-emitting device 100 without damaging the terminal electrode 116.

Figure 14B:
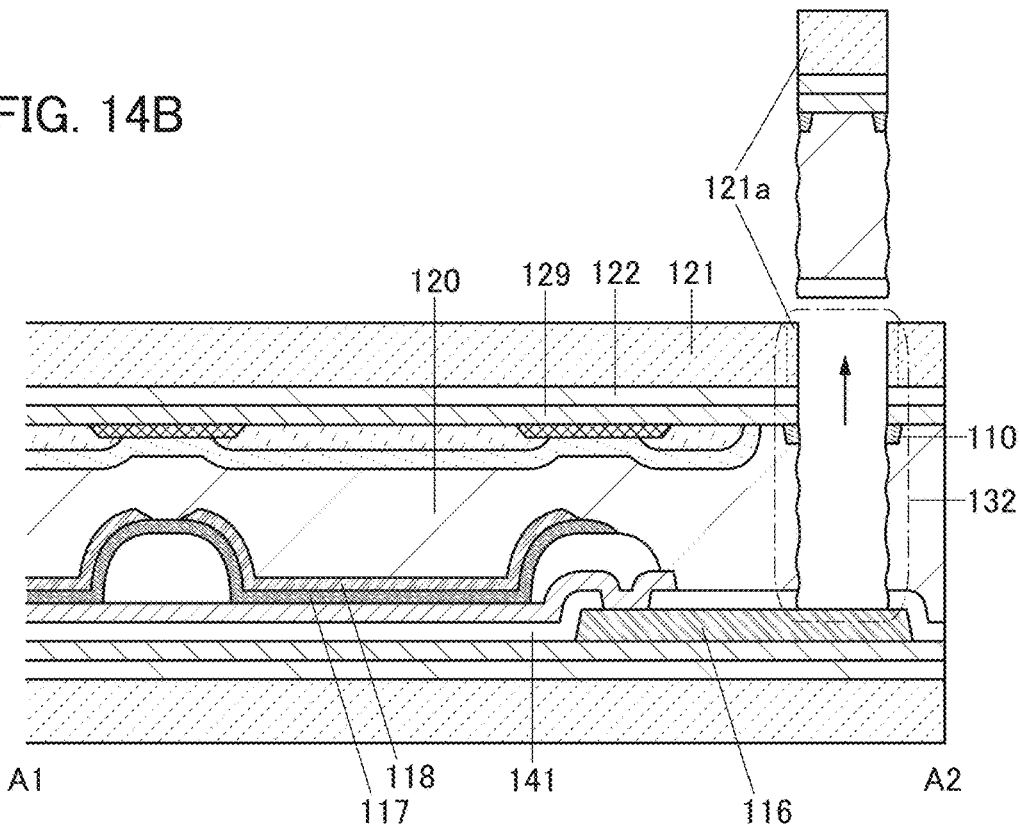

Next, the layers between the part of the portion 121a and the terminal electrode 116 overlapping with the part are separated from the light-emitting device 100 (see FIG. 14B). The layers can be separated by applying mechanical force. For example, an adhesive tape or the like is bonded to the portion 121a and is pulled, whereby the layers can be separated. Alternatively, the portion 121a may be pulled while being wound by rolling a structure body, such as a cylinder, having a rotation axis and a suction mechanism on its surface on the portion 121a. Through this step, the opening 132 is formed, and the terminal electrode 116 is partly exposed. In addition, part of the reflective layer 110 is removed through this step; however, the other part thereof remains in the light-emitting device 100.

At this time, the terminal electrode 116 can be exposed easily by pulling the portion 121a by lowering adhesion at an interface between the terminal electrode 116 and a layer in contact with the terminal electrode 116 (in this embodiment, the insulating layer 141). For example, a film having low adhesion to the terminal electrode 116 is formed over the region of the terminal electrode 116, which corresponds to the opening 132, thereby being removed together with the portion 121a. Also, the portion 121a can be pulled out utilizing low adhesion at an interface between the EL layer 117 and the electrode 118 that are provided in a region overlapping with the portion 121a over the terminal electrode 116 in a plan view, for example.

[Formation of External Electrode 124]

Next, the anisotropic conductive connection layer 123 is formed in and on the opening 132, and the external electrode 124 for inputting electric power or a signal to the light-emitting device 100 is formed over the anisotropic conductive connection layer 123 (see FIGS. 6A and 6B). The terminal electrode 116 is electrically connected to the external electrode 124 through the anisotropic conductive connection layer 123. Thus, electric power or a signal can be input to the light-emitting device 100. Note that, for example, an FPC can be used as the external electrode 124. A metal wire can also be used as the external electrode 124. Although the anisotropic conductive connection layer 123 may be used to connect the metal wire and the terminal electrode 116 to each other, the connection can be made by a wire bonding method without using the anisotropic conductive connection layer 123. Alternatively, the metal wire and the terminal electrode 116 can be connected to each other by a soldering method.

Modification Example

Figure 17A:
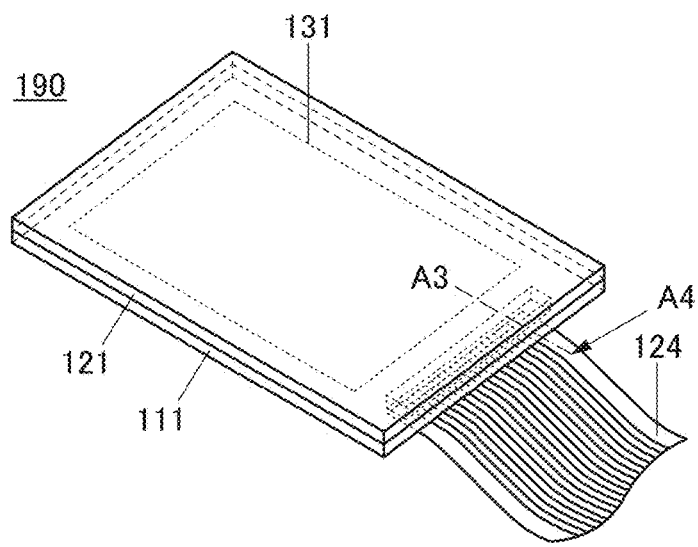
FIGS. 17A and 17B illustrate a structure example of a light-emitting device of an embodiment.
Figure 17B:
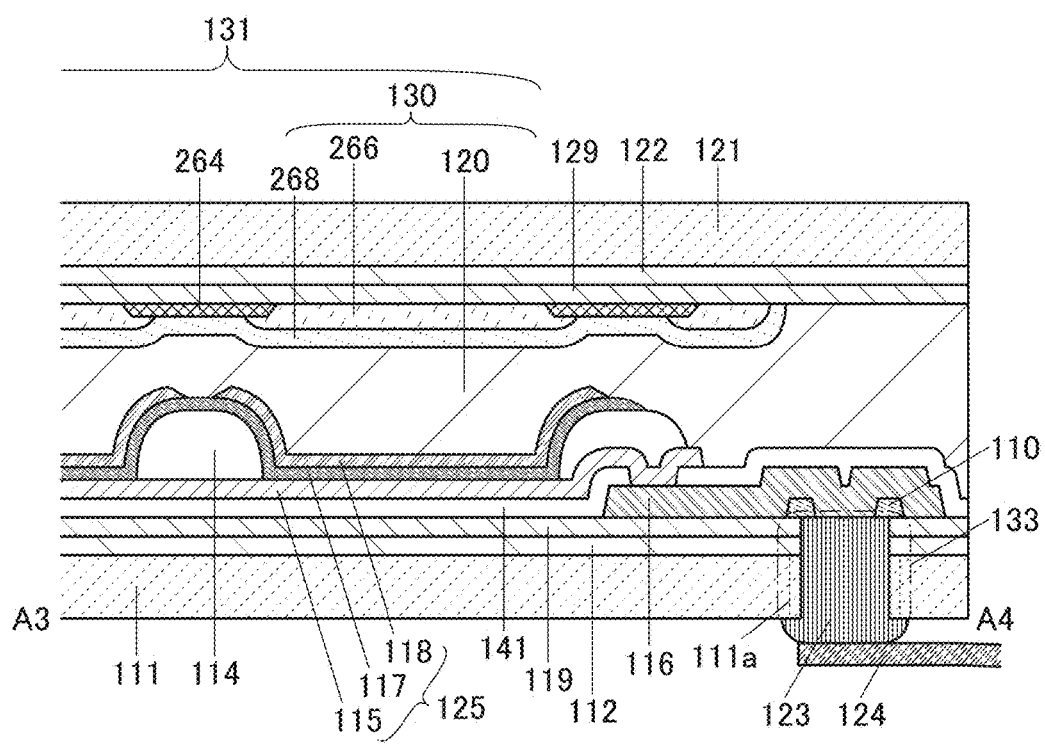

A modification example of the light-emitting device 100 described in this embodiment is described below. FIGS. 17A and 17B illustrate a light-emitting device 190 of one embodiment of the present invention, in which an external electrode is connected to the substrate 111 side. FIG. 17A is a perspective view of the light-emitting device 190, and FIG. 17B is a cross-sectional view taken along the dashed-dotted line A3-A4 in FIG. 17A. The light-emitting device 190 is different from the light-emitting device 100 in FIGS. 6A and 6B mainly in the structures of the reflective layer 110, the anisotropic conductive connection layer 123, and the external electrode 124.

In FIG. 17B, the reflective layer 110 is provided on the substrate 111 side between the insulating layer 119 and the terminal electrode 116. As in FIG. 15D, the reflective layer 110 is divided so that adjacent terminal electrodes 116 are not connected to each other. FIG. 15D is an enlarged top view of a peripheral portion of the reflective layer 110 at a stage before the irradiation with the laser light 220 in the manufacturing process of the light-emitting device 190. In FIG. 15D, the components of the light-emitting device 190 except the substrate 111, the reflective layer 110, and the terminal electrode 116 are omitted.

The manufacturing method of the light-emitting device 190 is different from the example of the manufacturing method of the light-emitting device 100 in that the reflective layer 110 is irradiated with the laser light 220 from the substrate 111 side in a step of forming an opening for connecting the terminal electrode 116 and the external electrode 124. After the irradiation with the laser light 220, part of a portion 111a overlapping with a region of the substrate 111 surrounded by the reflective layers 110, and the bonding layer 112 and the insulating layer 119 that overlap with the part are removed, whereby the terminal electrode 116 is exposed on the substrate 111 side and thus an opening 133 is formed.

The reflective layer 110 is thus provided between the insulating layer 119 and the terminal electrode 116, so that the external electrode 124 can be connected to the terminal electrode 116 on the substrate 111 side which is the opposite side of the light-emitting device 100. According to one embodiment of the present invention, a light-emitting device with high design flexibility can be obtained.

The light-emitting device or a display device of one embodiment of the present invention can employ various modes and can include various display elements. Examples of the display element include at least one of an electroluminescence (EL) element (e.g., an EL element including organic and inorganic materials, an organic EL element, or an inorganic EL element) including an LED (e.g., a white LED, a red LED, a green LED, or a blue LED), a transistor (a transistor that emits light depending on current), a plasma display panel (PDP), an electron emitting element, a liquid crystal element, an electrophoretic element, a display element using micro electro mechanical system (MEMS) such as a grating light valve (GLV), a digital micromirror device (DMD), a digital micro shutter (DMS) element, a MIRASOL (registered trademark) display, an interferometric modulator display (IMOD) element, and a piezoelectric ceramic display, and an electrowetting element. Other than the above, the display device may contain a display medium whose contrast, luminance, reflectance, transmittance, or the like is changed by electrical or magnetic action. Examples of a light-emitting device having EL elements include an EL display. Examples of a display device including an electron emitter include a field emission display (FED) and an SED-type flat panel display (SED: surface-conduction electron-emitter display). Examples of a display device including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an MN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

[Takt Time with Assumption of Mass Production]

Figure 18:
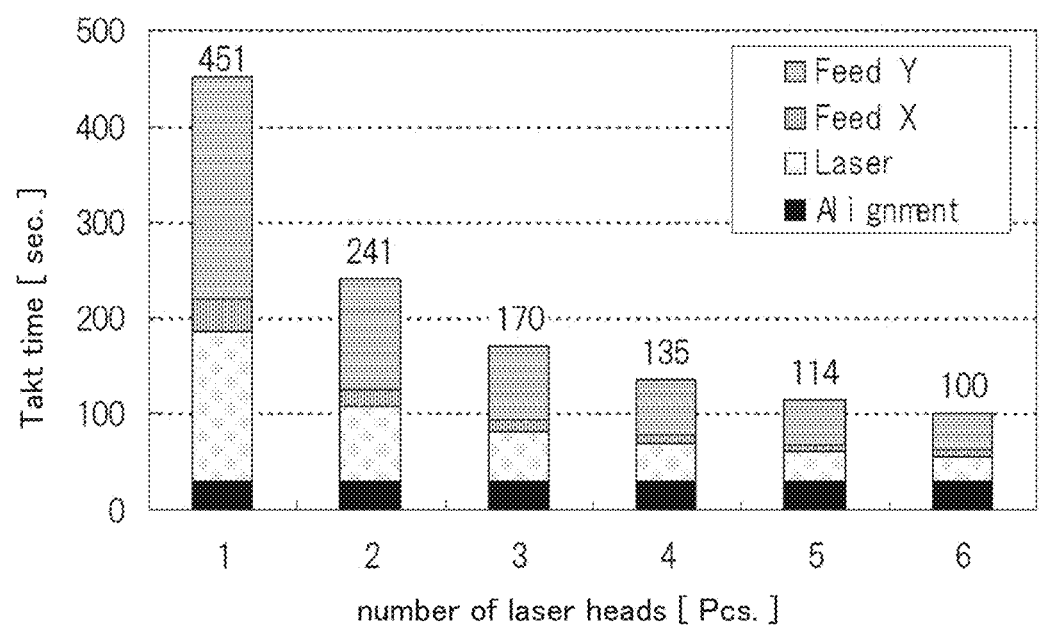
FIG. 18 shows calculation results of takt time.

On the assumption of mass production of the light-emitting device of one embodiment of the present invention, takt time of the above laser irradiation is calculated. The calculation results are shown in FIG. 18. Here, the takt time refers to time taken to irradiate a plurality of light-emitting devices (here, 110 light-emitting devices) provided over one substrate with laser light.

The condition in this calculation is as follows. Over a glass substrate having the size of 750 mm×1850 mm which is half the size of a large-sized glass substrate having the size of $6^{th}$ generation (1500 mm×1850 mm) (hereinafter the large-sized glass substrate is also referred to as G6), 110 (=5×22) light-emitting devices each with a display region with a 5-inch diagonal line (131 mm×82 mm) are provided. Time taken to adjust the position of the laser light irradiation is set to 30 sec., time taken for the laser irradiation is set to 1.4 seconds per panel, and the scanning speed of a laser irradiation port (also referred to as a laser head) or a stage for supporting the glass substrate in the X-Y direction is set to 50 mm/sec. Note that when the light-emitting device is irradiated with laser light, the laser irradiation port may be moved or the stage may be moved. Alternatively, the laser irradiation port and the stage may be moved simultaneously. High productivity can be achieved by an increase in the number of heads, that is, the number of laser heads from which laser irradiation is performed simultaneously, and the takt time can be set to 180 sec. or less by using three or more heads (see FIG. 18).

Figure 19:
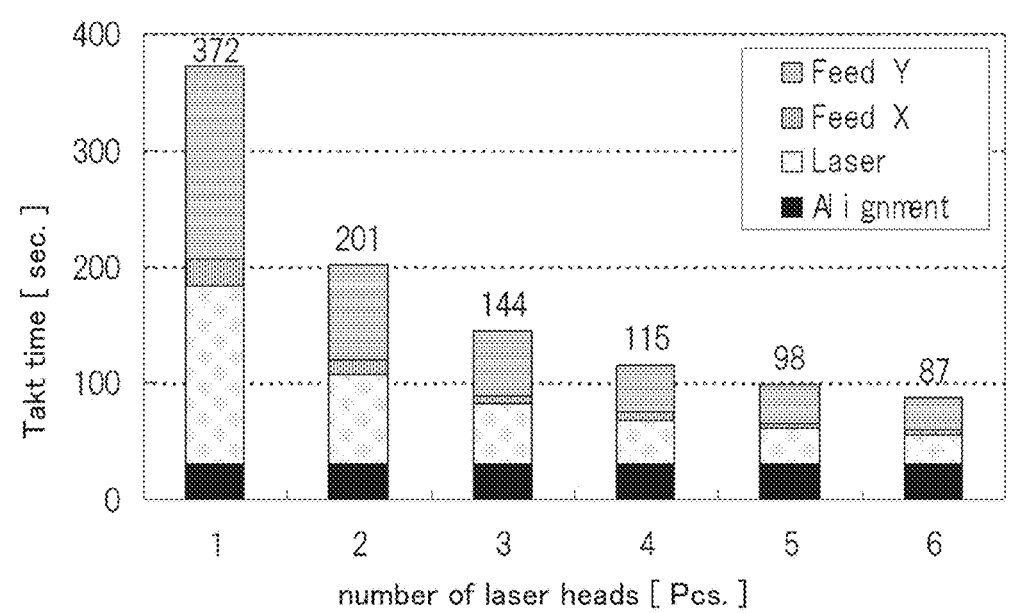
FIG. 19 shows calculation results of takt time.

Note that FIG. 18 shows the calculation results of the glass substrate whose short side is half that of the G6. Meanwhile, calculation results of a glass substrate whose long side is half that of the G6 is shown in FIG. 19. FIG. 19 is different from FIG. 18 in that 110 (=11×10) light-emitting devices each with a display region with a 5-inch diagonal line are provided over the glass substrate having the size of 1500 mm×925 mm. In FIG. 19 as well as FIG. 18, the takt time can be set to 180 sec. or less by using three or more heads.

This embodiment can be combined with any other embodiment as appropriate.

Embodiment 3

Figure 20A:
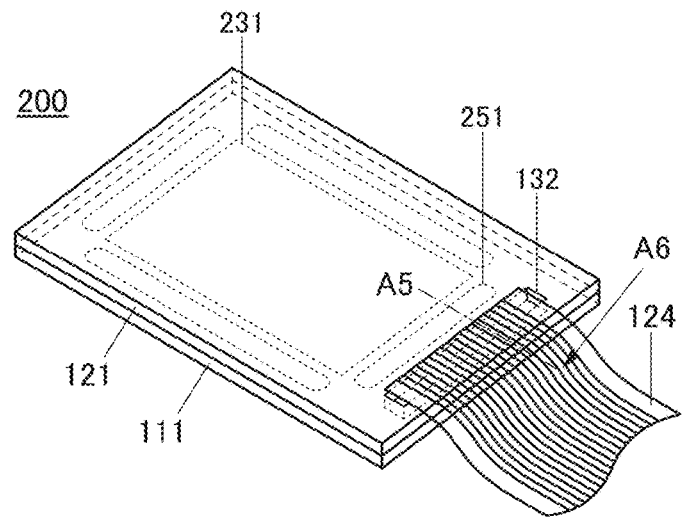
FIGS. 20A and 20B illustrate a structure example of a light-emitting device of an embodiment.
Figure 20B:
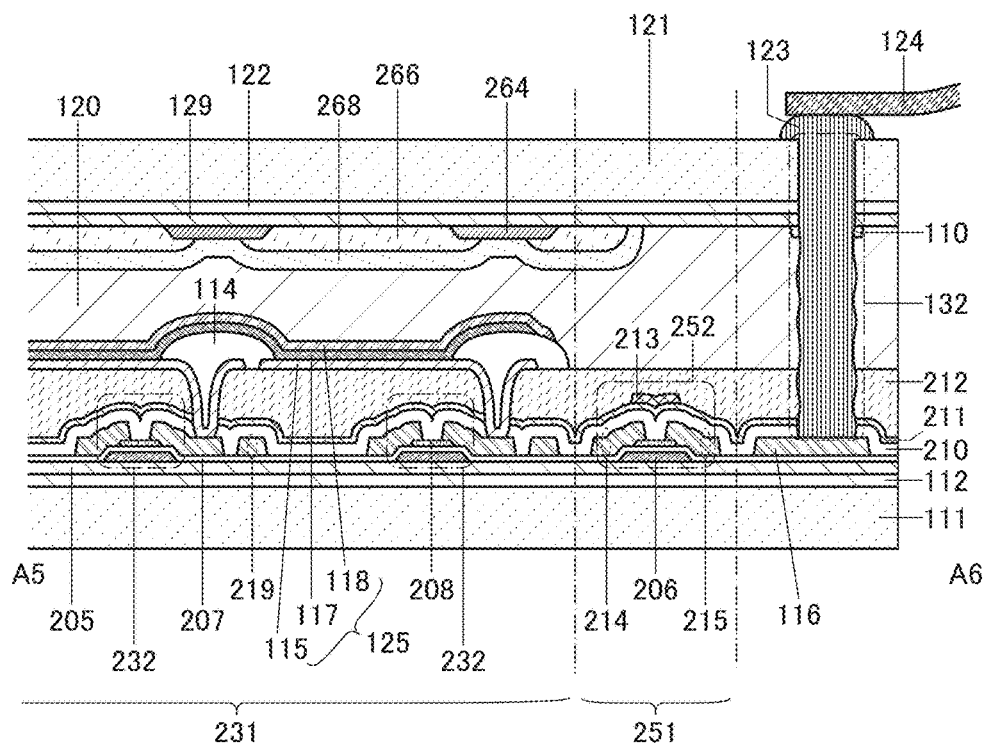

In this embodiment, a light-emitting device 200 having a structure different from the structure of the light-emitting device 100 described in the above embodiment will be described with reference to FIGS. 20A and 20B. FIG. 20A is a perspective view of the light-emitting device 200, and FIG. 20B is a cross-sectional view taken along the dashed-dotted line A5-A6 in FIG. 20A.

[Structure of Light-Emitting Device]

The light-emitting device 200 described in this embodiment includes a display region 231 and a peripheral circuit 251. The light-emitting device 200 further includes the terminal electrode 116 and the light-emitting element 125 including the electrode 115, the EL layer 117, and the electrode 118. A plurality of light-emitting elements 125 are formed in the display region 231. A transistor 232 for controlling the amount of light emitted from the light-emitting element 125 is connected to each light-emitting element 125.

The terminal electrode 116 is electrically connected to the external electrode 124 through the anisotropic conductive connection layer 123 formed in the opening 132. In addition, the terminal electrode 116 is electrically connected to the peripheral circuit 251.

The opening 132 is formed by the method described in Embodiment 2; therefore, part of the reflective layer 110 before the formation of the opening 132 is placed so as to surround the opening 132 in contact with the insulating layer 129. Therefore, in some cases, occurrence of breaking or cracking (also referred to as a crack) of the insulating layer 129 from the opening 132 side can be inhibited when the opening 132 is formed or when the light-emitting device 200 is used.

The peripheral circuit 251 includes a plurality of transistors 252. The peripheral circuit 251 has a function of determining which of the light-emitting elements 125 in the display region 231 is supplied with a signal from the external electrode 124.

In the light-emitting device 200 illustrated in FIGS. 20A and 20B, the substrate 111 and the substrate 121 are attached to each other with the bonding layer 120 provided therebetween. An insulating layer 205 is formed over the substrate 111 with the bonding layer 112 provided therebetween. The insulating layer 205 is preferably formed as a single layer or a multilayer using any of silicon oxide, silicon nitride, silicon oxynitride, silicon nitride oxide, aluminum oxide, aluminum oxynitride, and aluminum nitride oxide. The insulating layer 205 can be formed by a sputtering method, a CVD method, a thermal oxidation method, a coating method, a printing method, or the like.

The insulating layer 205 functions as a base layer and can prevent or reduce diffusion of impurity elements from the substrate 111, the bonding layer 112, or the like to the transistor or the light-emitting element.

The transistor 232, the transistor 252, the terminal electrode 116, and a wiring 219 are formed over the insulating layer 205. Although a channel-etched transistor that is a type of bottom-gate transistor is illustrated as the transistor 232 and/or the transistor 252 in this embodiment, a channel-protective transistor, a top-gate transistor, or the like can also be used. Alternatively, an inverted staggered transistor or a forward staggered transistor can also be used. It is also possible to use a dual-gate transistor, in which a semiconductor layer in which a channel is formed is provided between two gate electrodes. Furthermore, the transistor is not limited to a transistor having a single-gate structure; a multi-gate transistor having a plurality of channel formation regions, such as a double-gate transistor may be used.

As the transistor 232 and/or the transistor 252, a transistor with any of a variety of structures such as a planar type, a FIN-type, and a Tri-Gate type can be used.

The transistor 232 and the transistor 252 may have the same structure or different structures. However, the size (e.g., channel length and channel width) or the like of each transistor can be adjusted as appropriate.

The transistor 232 and the transistor 252 each include an electrode 206 that can function as a gate electrode, an insulating layer 207 that can function as a gate insulating layer, a semiconductor layer 208, an electrode 214 that can function as one of a source electrode and a drain electrode, and an electrode 215 that can function as the other of the source electrode and the drain electrode.

The wiring 219, the electrode 214, and the electrode 215 can be formed at the same time as the terminal electrode 116 using part of the conductive layers for forming the terminal electrode 116. The insulating layer 207 can be formed using a material and a method similar to those of the insulating layer 205.

The semiconductor layer 208 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used. In the case of using an oxide semiconductor for the semiconductor layer 208, a c-axis aligned crystalline oxide semiconductor (CAAC-OS), a polycrystalline oxide semiconductor, a microcrystalline oxide semiconductor, a nanocrystalline oxide semiconductor (nc-OS), an amorphous oxide semiconductor, or the like can be used.

Note that an oxide semiconductor has an energy gap as wide as 3.0 eV or more and high visible-light transmissivity. In a transistor obtained by processing an oxide semiconductor under appropriate conditions, the off-state current at ambient temperature (e.g., 25° C.) can be less than or equal to 100 zA ($1\times10^{-19}$ A), less than or equal to 10 zA ($1\times10^{-20}$ A), and further less than or equal to 1 zA ($1\times10^{-21}$ A). Therefore, a display device with low power consumption can be achieved.

In the case where an oxide semiconductor is used for the semiconductor layer 208, an insulating layer containing oxygen is preferably used as an insulating layer in contact with the semiconductor layer 208. For the insulating layer in contact with the semiconductor layer 208, it is particularly preferable to use an insulating layer from which oxygen is released by heat treatment.

An insulating layer 210 is formed over the transistor 232 and the transistor 252, and an insulating layer 211 is formed over the insulating layer 210. The insulating layer 210 and the insulating layer 211 each function as a protective insulating layer and can prevent or reduce diffusion of impurity elements from a layer above the insulating layer 210 to the transistor 232 and the transistor 252. The insulating layer 210 can be formed using a material and a method similar to those of the insulating layer 205.

Planarization treatment may be performed on the insulating layer 211 to reduce unevenness of a surface on which the light-emitting element 125 is formed. The planarization treatment may be, but not particularly limited to, polishing treatment (e.g., chemical mechanical polishing (CMP)) or dry etching treatment.

Forming an insulating layer 212 using an insulating material with a planarization function can omit polishing treatment. As the insulating material with a planarization function, for example, an organic material such as a polyimide resin or an acrylic resin can be used. Other than the above-described organic materials, it is also possible to use a low-dielectric constant material (low-k material) or the like. Note that the insulating layer 212 may be formed by stacking a plurality of insulating films formed of these materials.

Over the insulating layer 212, the light-emitting element 125 and the partition 114 for separating the adjacent light-emitting elements 125 are formed.

The substrate 121 is provided with the light-blocking layer 264, the coloring layer 266, and the overcoat layer 268. The light-emitting device 200 is what is called a top-emission light-emitting device, in which light emitted from the light-emitting element 125 is extracted from the substrate 121 side through the coloring layer 266.

The light-emitting element 125 is electrically connected to the transistor 232 through an opening formed in the insulating layer 212, the insulating layer 211 and the insulating layer 210.

With a micro optical resonator (also referred to as microcavity) structure which allows light emitted from the EL layer 117 to resonate, lights with different wavelengths and narrowed spectra can be extracted even when one EL layer 117 is used for different light-emitting elements 125.

FIGS. 21A and 21B are cross-sectional views of the light-emitting device 200 in which the light-emitting element 125 has a microcavity structure, for example. Note that FIG. 21A corresponds to a cross-sectional view taken along the vicinity of the dashed-dotted line A5-A6 in FIG. 20A. FIG. 21B is an enlarged view of a portion 280 in FIG. 21A.

In the case where the light-emitting element 125 has a microcavity structure, the electrode 118 is formed using a conductive material (a semi-transmissive material) which transmits and reflect a certain amount of light of the incident light, and the electrode 115 is formed using a stack of a conductive material having high reflectance (the reflectance of visible light is 50% or more and 100% or less, preferably 70% or more and 100% or less) and a conductive material having high transmittance (the transmittance of visible light is 50% or more and 100% or less, preferably 70% or more and 100% or less). Here, the electrode 115 is formed of a stack of an electrode 115a formed using a conductive material that reflects light and an electrode 115b formed using a conductive material that transmits light. The electrode 115b is provided between the EL layer 117 and the electrode 115a (see FIG. 21B). The electrode 118 and the electrode 115a each can function as a reflective electrode.

For example, the electrode 118 may be formed using a conductive material containing silver (Ag) or a conductive material containing aluminum (Al) having a thickness of 1 nm to 30 nm, preferably 1 nm to 15 nm. In this embodiment, as the electrode 118, a 10-nm-thick conductive material containing silver and magnesium is used.

The electrode 115a may be formed using a conductive material containing silver (Ag) or a conductive material containing aluminum (Al) having a thickness of 50 nm to 500 nm, preferably 50 nm to 200 nm. In this embodiment, the electrode 115a is formed using a 100-nm-thick conductive material containing silver.

For the electrode 115b, a conductive oxide containing indium (In) or a conductive oxide containing zinc (Zn) having a thickness of 1 nm to 200 nm, preferably 5 nm to 100 nm, may be used. In this embodiment, indium tin oxide is used for the electrode 115b. Furthermore, a conductive oxide may be provided under the electrode 115a.

By changing the thickness t of the electrode 115b, an optical distance (light path length) d from the interface between the electrode 118 and the EL layer 117 to the interface between the electrode 115a and the electrode 115b can be set to an arbitral value. The light-emitting elements 125 having different emission spectra for respective pixels can be provided even when one EL layer 117 is used by changing the thickness t of the electrode 115b in each pixel. Thus, color purity of each emission color is improved and a light-emitting device having favorable color reproducibility can be achieved. It is not necessary to independently form the EL layer 117 in each pixel depending on the emission color; therefore, the number of manufacturing steps of the light-emitting device can be reduced and thus the productivity can be improved. Furthermore, a high-definition light-emitting device can be achieved easily.

FIG. 21A shows an example in which the pixel 130R, the pixel 130G, the pixel 130B, and the pixel 130Y that emit red light 151R, green light 151G, blue light 151B, and yellow light 151Y, respectively, are used as one pixel 140. Note that one embodiment of the present invention is not limited to this example. As the pixel 140, subpixels that emit lights of red, green, blue, yellow, cyan, magenta, and white may be combined as appropriate. For example, the pixel 140 may be formed of the following three subpixels: the pixel 130R, the pixel 130G, and the pixel 130B.

Note that a method for adjusting the optical distance d is not limited to the above method. For example, the optical distance d may be adjusted by changing the film thickness of the EL layer 117.

Figure 22:
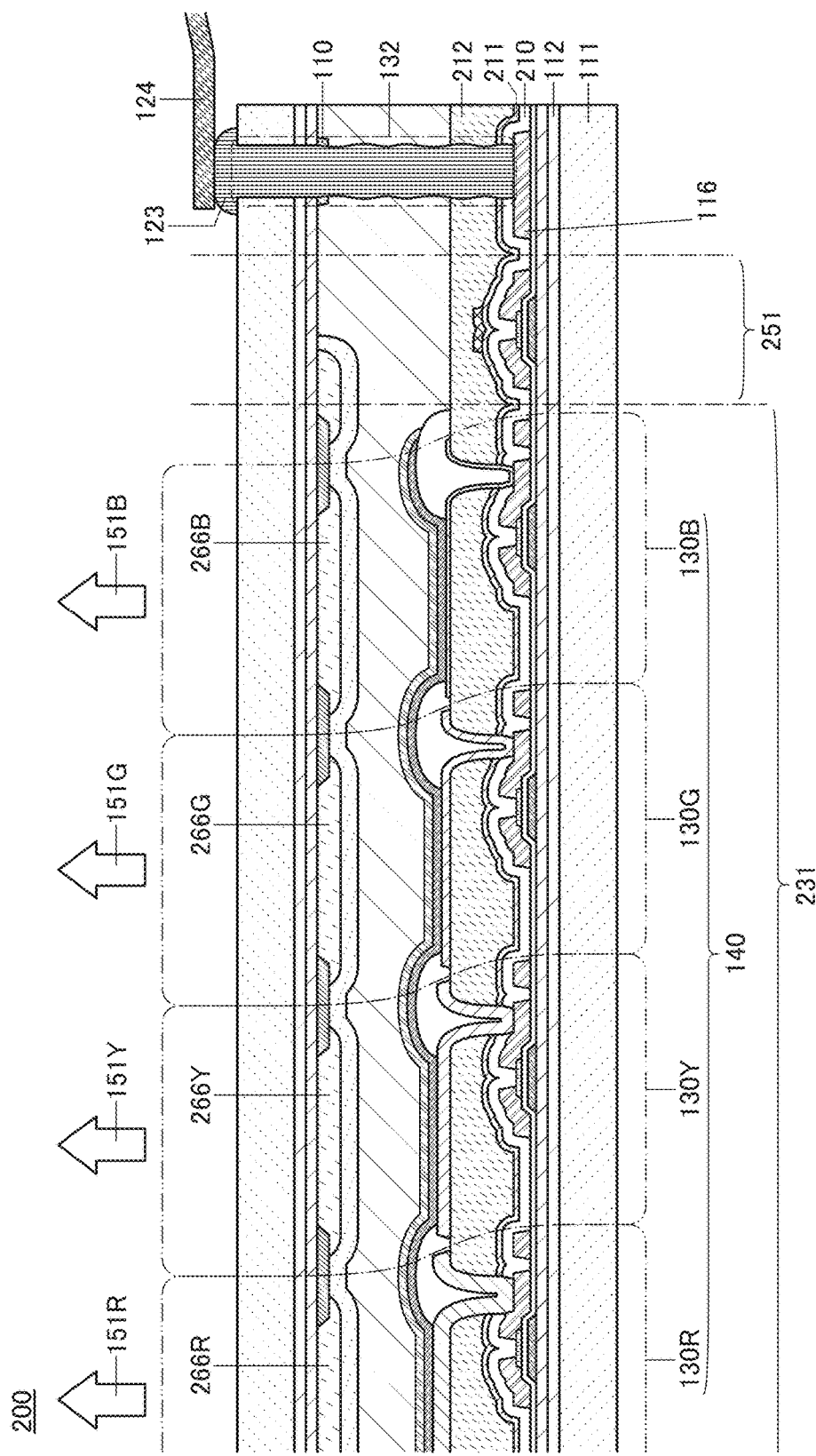
FIG. 22 illustrates a structure example of a light-emitting device of an embodiment.

The coloring layer 266 may be provided in a position overlapping with the light-emitting element 125 so that the light 151 is emitted outside through the coloring layer 266. FIG. 22 shows a structure example in the case where the coloring layer 266 is combined with the light-emitting device 200 illustrated in FIGS. 21A and 21B. In the light-emitting device 200 illustrated in FIG. 22, a coloring layer 266R, a coloring layer 266G, a coloring layer 266B, and a coloring layer 266Y that transmit light in a red wavelength band, light in a green wavelength band, light in a blue wavelength band, and light in a yellow wavelength band, respectively, are provided so as to overlap with the pixel 130R that emits the red light 151R, the pixel 130G that can emit the green light 151G, the pixel 130B that can emit the blue light 151B, and the pixel 130Y that can emit the yellow light 151Y, respectively.

By using the pixel 130Y in addition to the pixel 130R, the pixel 130G, and the pixel 130B, the color reproducibility of the light-emitting device can be increased. In the case where the pixel 140 is formed of only the pixel 130R, the pixel 130G, and the pixel 130B, all of the pixels 130R, 130G, and 130B need to emit light when white light is emitted from the pixel 140. When the pixel 130Y is provided in addition to the pixel 130R, the pixel 130G, and the pixel 130B, white light can be obtained by emitting light only from the pixel 130B and the pixel 130Y. Thus, since white light can be obtained even without light emission from the pixel 130R and the pixel 130G, power consumption of the light-emitting device can be reduced.

Moreover, the pixel 130W that can emit white light 151W may be used instead of the pixel 130Y. The use of the pixel 130W instead of the pixel 130Y allows emission of white light by emitting light only from the pixel 130W; therefore, power consumption of the light-emitting device can be further reduced.

Note that in the case of using the pixel 130W, a coloring layer is not necessarily provided in the pixel 130W. Without a coloring layer, the luminance of the display region is improved and a light-emitting device having favorable visibility can be achieved. Moreover, power consumption of the light-emitting device can be further reduced.

The pixel 130W may be provided with a coloring layer 266W that transmits light in a white wavelength band. The color temperature of the white light 151W can be changed by providing the coloring layer 266W that transmits light in a white wavelength band in the pixel 130W. Accordingly, a light-emitting device having a high display quality can be achieved.

The color purity of the light 151 can be further improved by using the light-emitting element 125 having a microcavity structure and the coloring layer 266 in combination. Therefore, the color reproducibility of the light-emitting device 200 can be improved. In addition, light that enters from the outside is mostly absorbed by the coloring layer 266; therefore, reflection of the light that enters from the outside on the display region 231 is suppressed and thus the visibility of the light-emitting device can be improved. Accordingly, a light-emitting device having a high display quality can be achieved.

Although an active matrix light-emitting device is described as an example of the light-emitting device in this embodiment, one embodiment of the present invention can also be applied to a passive matrix light-emitting device. Moreover, one embodiment of the present invention can also be applied to a light-emitting device having a bottom-emission structure or a dual-emission structure.

This embodiment can be implemented in an appropriate combination with any of the structures described in the other embodiments.

Embodiment 4

In this embodiment, structure examples of a light-emitting element that can be used as the light-emitting element 125 will be described. Note that an EL layer 620 described in this embodiment corresponds to the EL layer 117 described in the other embodiments.

[Structure of Light-Emitting Element]

Figure 23A:
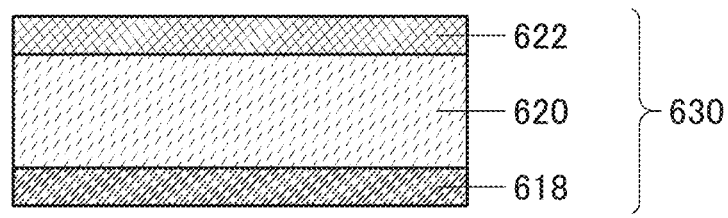
FIGS. 23A and 23B each illustrate a structure example of a light-emitting element of an embodiment.

In a light-emitting element 630 illustrated in FIG. 23A, the EL layer 620 is sandwiched between a pair of electrodes (electrodes 618 and 622). Note that the electrode 618 is used as an anode and the electrode 622 is used as a cathode as an example in the following description of this embodiment.

The EL layer 620 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron and hole transport properties), or the like can be used. Specifically, functional layers such as a hole-injection layer, a hole-transport layer, an electron-transport layer, and an electron-injection layer can be used in appropriate combination.

The light-emitting element 630 illustrated in FIG. 23A emits light when current flows by applying a potential difference between the electrode 618 and the electrode 622 and holes and electrons are recombined in the EL layer 620. In other words, a light-emitting region is formed in the EL layer 620.

In one embodiment of the present invention, light emitted from the light-emitting element 630 is extracted to the outside from the electrode 618 side or the electrode 622 side. Thus, one of the electrodes 618 and 622 is formed using a light-transmitting substance.

Figure 23B:
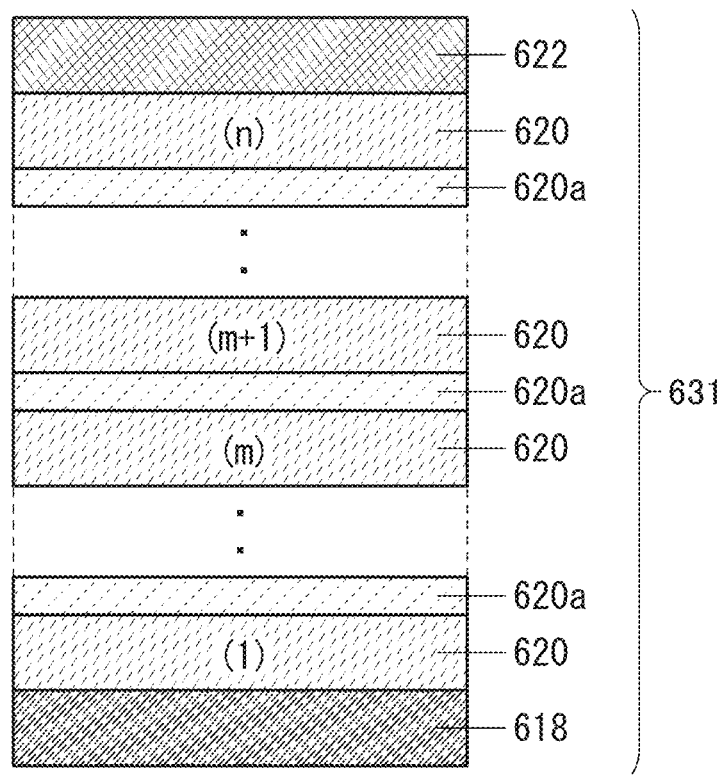

Note that a plurality of EL layers 620 may be stacked between the electrode 618 and the electrode 622 as in a light-emitting element 631 illustrated in FIG. 23B. In the case where n (n is a natural number of 2 or more) layers are stacked, an electric charge generation layer 620a is preferably provided between an m-th EL layer 620 and an (m+1)th EL layer 620. Note that m is a natural number greater than or equal to 1 and less than n. The components other than the electrode 618 and the electrode 622 correspond to the EL layer 117 of the aforementioned embodiments.

The electric charge generation layer 620a can be formed using a composite material of an organic compound and a metal oxide. Examples of the metal oxide include vanadium oxide, molybdenum oxide, tungsten oxide, or the like. As the organic compound, a variety of compounds can be used; for example, an aromatic amine compound, a carbazole derivative, an aromatic hydrocarbon, and an oligomer, a dendrimer, and a polymer having a basic skeleton of these compounds can be used. Note that as the organic compound, it is preferable to use an organic compound that has a hole-transport property and has a hole mobility of $10^{-6}$ cm$^2$/Vs or higher. However, other substances may be used as long as their hole-transport properties are higher than their electron-transport properties. These materials used for the electric charge generation layer 620a have excellent carrier-injection properties and carrier-transport properties; thus, the light-emitting element 630 can be driven with low current and with low voltage. Other than the composite material, the metal oxide, a composite material of an organic compound and an alkali metal, an alkaline earth metal, or a compound of the alkali metal or the alkaline earth metal can be used in the electric charge generation layer 620a.

Note that the electric charge generation layer 620a may be formed by a combination of a composite material of an organic compound and a metal oxide with another material. For example, the electric charge generation layer 620a may be formed by a combination of a layer containing the composite material of an organic compound and a metal oxide with a layer containing one compound selected from electron-donating substances and a compound having a high electron-transport property. Furthermore, the electric charge generation layer 620a may be formed by a combination of a layer containing the composite material of an organic compound and a metal oxide with a transparent conductive film.

The light-emitting element 631 having such a structure is unlikely to result in energy transfer between the adjacent EL layers 620 and can easily realize high emission efficiency and a long lifetime. Furthermore, it is easy to obtain phosphorescence from one light-emitting layer and fluorescence from the other light-emitting layer.

The electric charge generation layer 620a has a function of injecting holes to one of the EL layers 620 that is in contact with the electric charge generation layer 620a and a function of injecting electrons to the other EL layer 620 that is in contact with the electric charge generation layer 620a, when voltage is applied to the electrodes 618 and 622.

The light-emitting element 631 illustrated in FIG. 23B can provide a variety of emission colors by changing the type of the light-emitting substance used for the EL layers 620. In addition, a plurality of light-emitting substances having different emission colors may be used as the light-emitting substances, so that light emission having a broad spectrum or white light emission can be obtained.

In the case of obtaining white light emission using the light-emitting element 631 in FIG. 23B, as for a combination of a plurality of EL layers, a structure for emitting white light including red light, blue light, and green light may be used. For example, the structure may include an EL layer containing a blue fluorescent substance as a light-emitting substance and an EL layer containing green and red phosphorescent substances as light-emitting substances. Alternatively, the structure may include an EL layer emitting red light, an EL layer emitting green light, and an EL emitting blue light. Further alternatively, with a structure including EL layers emitting light of complementary colors, white light emission can be obtained. In a stacked-layer element including two light-emitting layers in which light emitted from one of the light-emitting layers and light emitted from the other light-emitting layer have complementary colors to each other, the combinations of colors are as follows: blue and yellow, blue-green and red, and the like.

Note that in the structure of the above stacked-layer element, by providing the electric charge generation layer between the stacked light-emitting layers, the element can give a high-luminance region at a low current density, and have a long lifetime.

This embodiment can be implemented in an appropriate combination with any of the structures described in the other embodiments.

Embodiment 5

In this embodiment, electronic devices and lighting devices which can be manufactured by one embodiment of the present invention will be described with reference to FIGS. 24A to 24G and FIGS. 25A to 25I.

The light-emitting device of one embodiment of the present invention can be flexible. Therefore, the light-emitting device of one embodiment of the present invention can be used in electronic devices and lighting devices having flexibility.

Examples of electronic devices include television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

A touch panel of one embodiment of the present invention has flexibility and therefore can be incorporated along a curved inside/outside wall surface of a house or a building or a curved interior/exterior surface of a car.

Figure 24A:
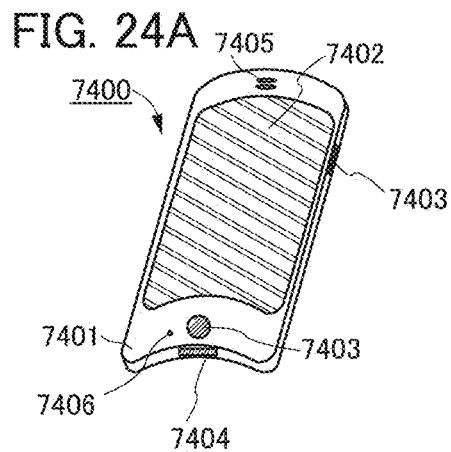
FIGS. 24A and 24B illustrate structure examples of electronic devices.

FIG. 24A illustrates an example of a cellular phone. A cellular phone 7400 includes a display portion 7402 incorporated in a housing 7401, an operation button 7403, an external connection port 7404, a speaker 7405, a microphone 7406, and the like. Note that the cellular phone 7400 is manufactured using the light-emitting device of one embodiment of the present invention for the display portion 7402. According to one embodiment of the present invention, a highly reliable cellular phone having a curved display portion can be provided.

When the display portion 7402 of the cellular phone 7400 in FIG. 24A is touched with a finger or the like, information can be input into the cellular phone 7400. Moreover, operations such as making a call and inputting a letter can be performed by touch on the display portion 7402 with a finger or the like.

With the operation button 7403, power ON or OFF can be switched. In addition, a variety of images displayed on the display portion 7402 can be switched; switching a mail creation screen to a main menu screen, for example.

Figure 24B:
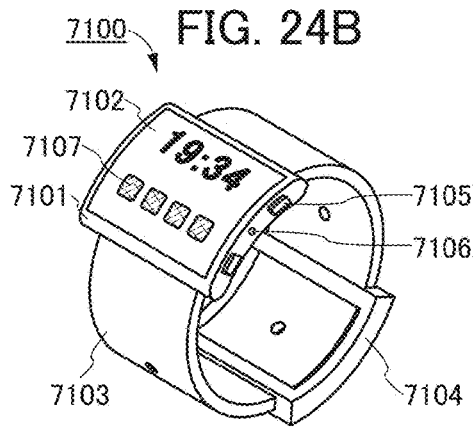

FIG. 24B is an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, power ON/OFF, ON/OFF of wireless communication, setting and cancellation of manner mode, and setting and cancellation of power saving mode can be performed. For example, the functions of the operation button 7105 can be set freely by setting the operation system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes a light-emitting device manufactured by one embodiment of the present invention. According to one embodiment of the present invention, a highly reliable portable information terminal having a curved display portion can be provided.

Figure 24C:
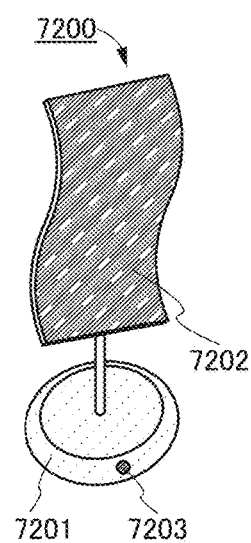
FIGS. 24C to 24G illustrate structure examples of lighting devices.
Figure 24D:
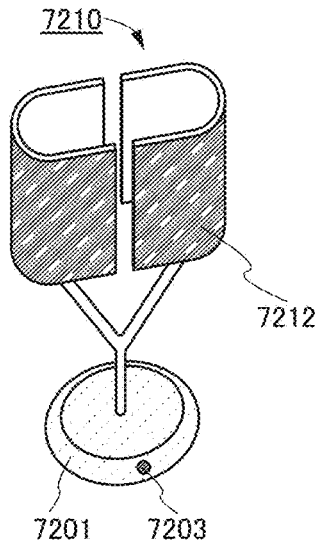
Figure 24E:
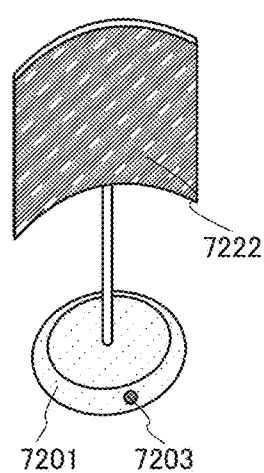

FIGS. 24C to 24E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 24C includes a light-emitting portion 7202 having a wave-shaped light-emitting surface, which is a good-design lighting device.

A light-emitting portion 7212 included in the lighting device 7210 in FIG. 24D has two convex-curved light-emitting portions symmetrically placed. Thus, all directions can be illuminated with the lighting device 7210 as a center.

The lighting device 7220 illustrated in FIG. 24E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, each light-emitting portion includes a light-emitting device of one embodiment of the present invention. According to one embodiment of the present invention, a highly reliable lighting device having a curved display portion can be provided.

Figure 24F:
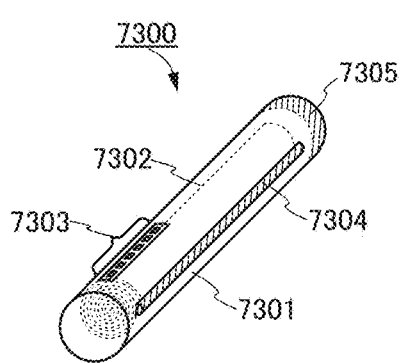

FIG. 24F illustrates an example of a portable touch panel. A touch panel 7300 includes a housing 7301, a display portion 7302, operation buttons 7303, a display portion pull 7304, and a control portion 7305.

The touch panel 7300 includes a rolled flexible display portion 7302 in the cylindrical housing 7301.

The touch panel 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

With the operation buttons 7303, power ON/OFF, switching of displayed videos, and the like can be performed.

Figure 24G:
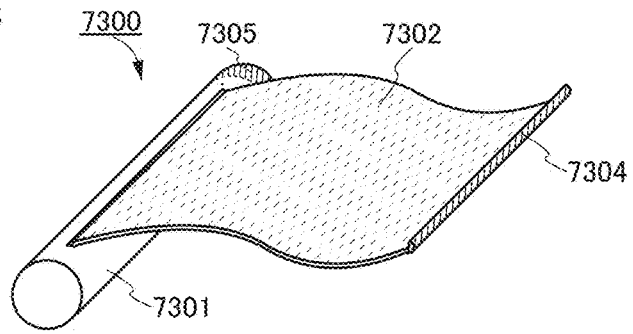

FIG. 24G illustrates the touch panel 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation buttons 7303 are provided not in the center of the housing 7301 but on one side of the housing 7301 as illustrated in FIG. 24F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes a light-emitting device of one embodiment of the present invention. According to one embodiment of the present invention, a lightweight and highly reliable touch panel can be provided.

Figure 25A:
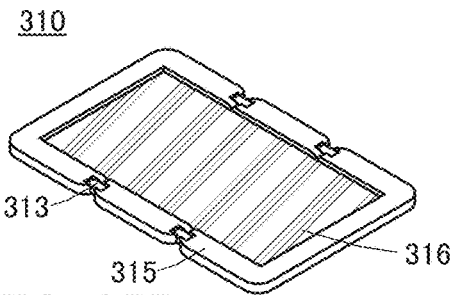
FIGS. 25A to 25I each illustrate structure examples of electronic devices of an embodiment.
Figure 25B:
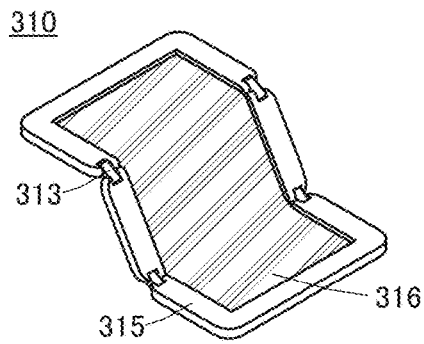
Figure 25C:
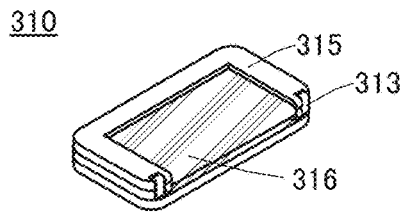

FIGS. 25A to 25C illustrate a foldable portable information terminal 310. FIG. 25A illustrates the portable information terminal 310 that is opened. FIG. 25B illustrates the portable information terminal 310 that is being opened or being folded. FIG. 25C illustrates the portable information terminal 310 that is folded. The portable information terminal 310 is highly portable when folded. The portable information terminal 310 is highly browsable when opened because of its seamless large display region.

A display panel 316 is supported by three housings 315 joined together by hinges 313. By folding the portable information terminal 310 at a connection portion between two housings 315 with the hinges 313, the portable information terminal 310 can be reversibly changed in shape from an opened state to a folded state. A light-emitting device of one embodiment of the present invention can be used for the display panel 316. For example, a light-emitting device that can be bent with a radius of curvature of greater than or equal to 1 mm and less than or equal to 150 mm can be used.

Figure 25D:
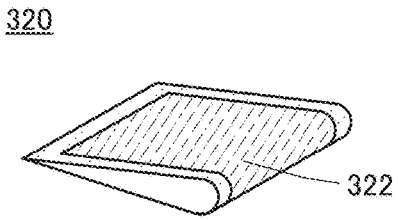
Figure 25E:
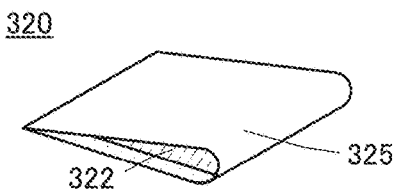

FIGS. 25D and 25E each illustrate a foldable portable information terminal 320. FIG. 25D illustrates the portable information terminal 320 that is folded so that a display portion 322 is on the outside. FIG. 25E illustrates the portable information terminal 320 that is folded so that the display portion 322 is on the inside. When the portable information terminal 320 is not used, the portable information terminal 320 is folded so that a non-display surface 325 faces the outside, whereby the display portion 322 can be prevented from being contaminated or damaged. A light-emitting device of one embodiment of the present invention can be used for the display portion 322.

Figure 25F:
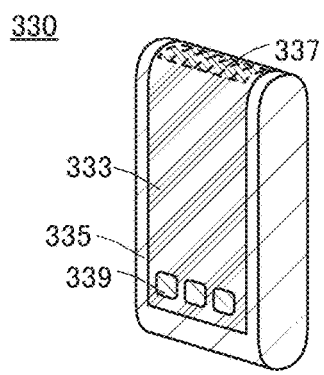
Figure 25G:
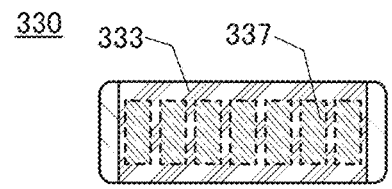
Figure 25H:
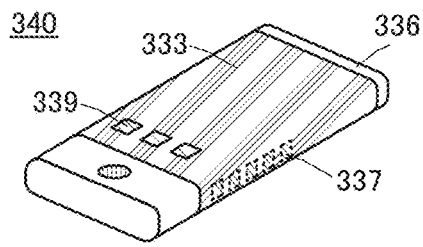

FIG. 25F is a perspective view illustrating an external shape of the portable information terminal 330. FIG. 25G is a top view of the portable information terminal 330. FIG. 25H is a perspective view illustrating an external shape of a portable information terminal 340.

The portable information terminals 330 and 340 each function as, for example, one or more of a telephone set, a notebook, an information browsing system, and the like. Specifically, the portable information terminals 330 and 340 each can be used as a smartphone.

The portable information terminals 330 and 340 can display characters and image information on its plurality of surfaces. For example, three operation buttons 339 can be displayed on one surface (FIGS. 25F and 25H). In addition, information 337 indicated by dashed rectangles can be displayed on another surface (FIGS. 25G and 25H). Examples of the information 337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 339, an icon, or the like may be displayed in place of the information 337. Although FIGS. 25F and 25G illustrate an example in which the information 337 is displayed at the top, one embodiment of the present invention is not limited thereto. For example, the information may be displayed on the side as in the portable information terminal 340 in FIG. 25H.

For example, a user of the portable information terminal 330 can see the display (here, the information 337) with the portable information terminal 330 put in a breast pocket of his/her clothes.

Specifically, a caller's phone number, name, or the like of an incoming call is displayed in a position that can be seen from above the portable information terminal 330. Thus, the user can see the display without taking out the portable information terminal 330 from the pocket and decide whether to answer the call.

A light-emitting device of one embodiment of the present invention can be used for a display portion 333 mounted in each of a housing 335 of the portable information terminal 330 and a housing 336 of the portable information terminal 340. One embodiment of the present invention makes it possible to provide a highly reliable touch panel having a curved display portion.

Figure 25I:
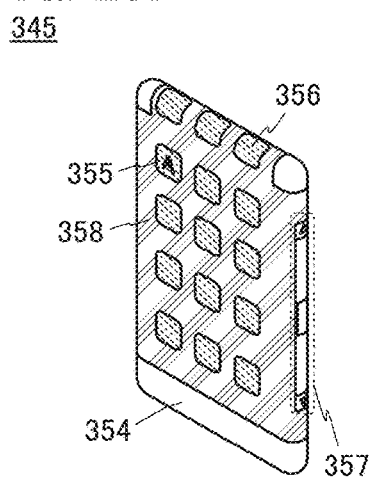

As in a portable information terminal 345 illustrated in FIG. 25I, information may be displayed on three or more surfaces. Here, information 355, information 356, and information 357 are displayed on different surfaces.

For a display portion 358 included in a housing 354 of the portable information terminal 345, a light-emitting device of one embodiment of the present invention can be used. One embodiment of the present invention makes it possible to provide a highly reliable touch panel having a curved display portion.

This embodiment can be combined with any other embodiment as appropriate.

Note that content (or may be part of the content) described in one embodiment may be applied to, combined with, or replaced by different content (or may be part of the different content) described in the embodiment and/or content (or may be part of the content) described in one or more different embodiments.

Note that in each embodiment, content described in the embodiment is content described with reference to a variety of diagrams or content described with a text described in the specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in another embodiment or other embodiments, much more diagrams can be formed.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) and constitute one embodiment of the invention. For another example, it is possible to take out M layers (M is an integer, where M<N) from a cross-sectional view in which N layers (N is an integer) are provided and constitute one embodiment of the invention. For another example, it is possible to take out M elements (M is an integer, where M<N) from a flow chart in which N elements (N is an integer) are provided and constitute one embodiment of the invention. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, what is illustrated in at least a diagram (which may be part of the diagram) is disclosed as one embodiment of the invention, and one embodiment of the invention can be constituted. Therefore, when certain contents are described in a diagram, the contents are disclosed as one embodiment of the invention even when the contents are not described with text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

EXAMPLE

In this example, a driver IC was mounted on a terminal portion of a light-emitting device having flexibility (a flexible display) to check whether a crack occurred. Note that the light-emitting device of one embodiment of the present invention can be used as the flexible display.

Figure 26:
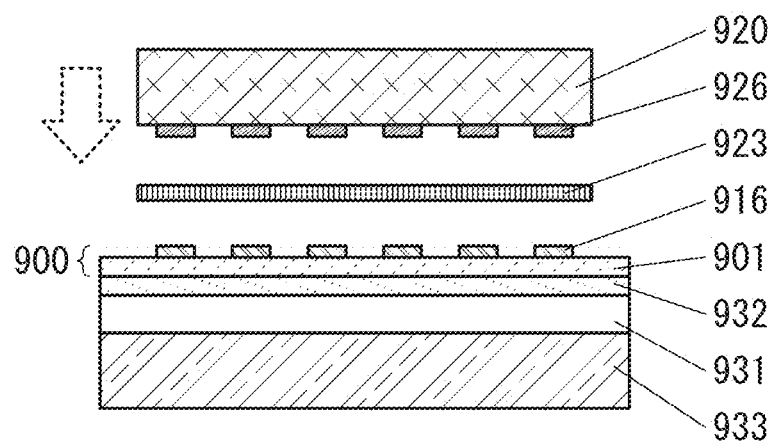
FIG. 26 illustrates a manner of pressure bonding a driver IC of an example.

FIG. 26 is a schematic cross-sectional view illustrating pressure bonding of a driver IC 920 to a flexible display 900. A plurality of terminal electrodes 916 are exposed on a flexible substrate 901 of the flexible display 900. The driver IC 920 is provided with a plurality of bumps 926. Here, to have planarity, the flexible display 900 was fixed to a glass substrate 931 serving as a support substrate with a temporary fixing film 932 provided therebetween. The glass substrate 931 was adsorbed by an adsorption mechanism provided on a stage 933. As the temporary fixing film 932, a film having a thickness of approximately 90 µm in which a silicone resin layer and a polyester film were stacked was used.

Note that the temporary fixing film 932 is not limited to this film as long as the support substrate and the flexible substrate can be fixed to each other and the flexible substrate can be held in a planar manner. Moreover, the temporary fixing film 932 is preferably as thin as possible; for example, a film having a thickness of 300 µm or less, preferably a thickness of 200 µm or less, further preferably a thickness of 100 µm or less, and still further preferably a thickness of 50 µm or less is used.

The glass substrate 931 and the temporary fixing film 932 are not necessarily provided in the case where the stage 933 can fix the flexible display 900 with high planarity without floating part of the flexible display 900. Examples of such a stage include a stage having an electrostatic chuck, a stage having an adsorption chuck in which a porous member such as ceramic is used for an adsorption portion, and the like.

An anisotropic conductive film (ACF) 923 was provided between the driver IC 920 and the flexible substrate 901 and pressure bonding was performed. The minimum pitch of the bumps 926 was 34.5 µm, the size of the bump 926 was 18 µm×100 µm, and the number of the bumps 926 was 3,534. As the ACF 923, an ACF in which the density of conductive particles was 60,000 particles/mm$^2$ and the diameter of the conductive particle was 3.2 µm was used. Pressure bonding was performed for 10 sec. at a temperature of 150° C. and a pressure of 33 kgf (327 N).

Figure 27A:
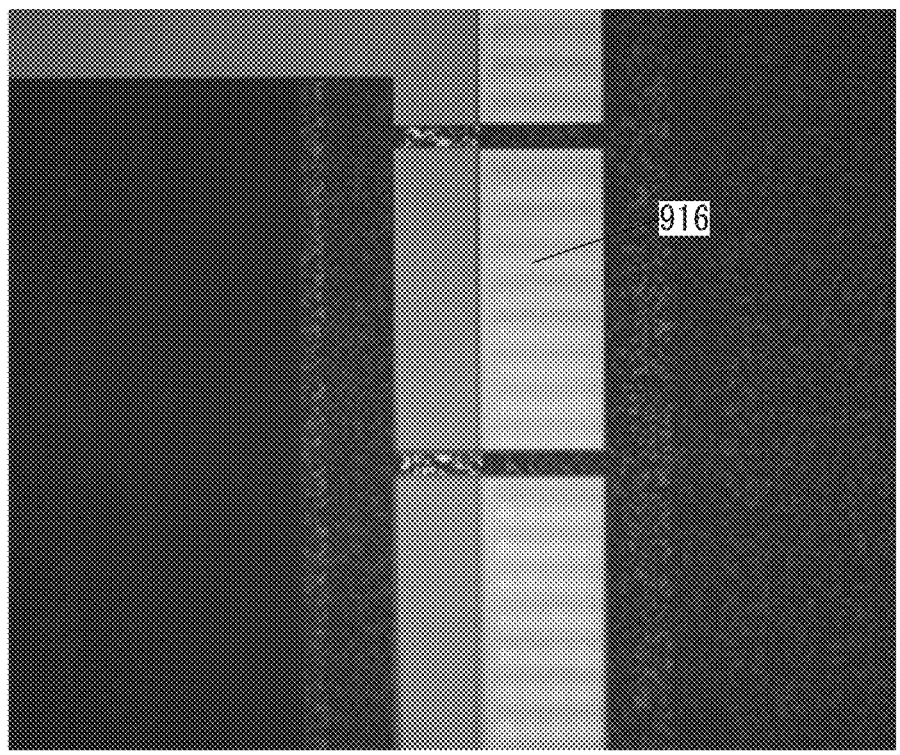
FIGS. 27A and 27B are optical micrographs of a flexible display of an example.
Figure 27B:
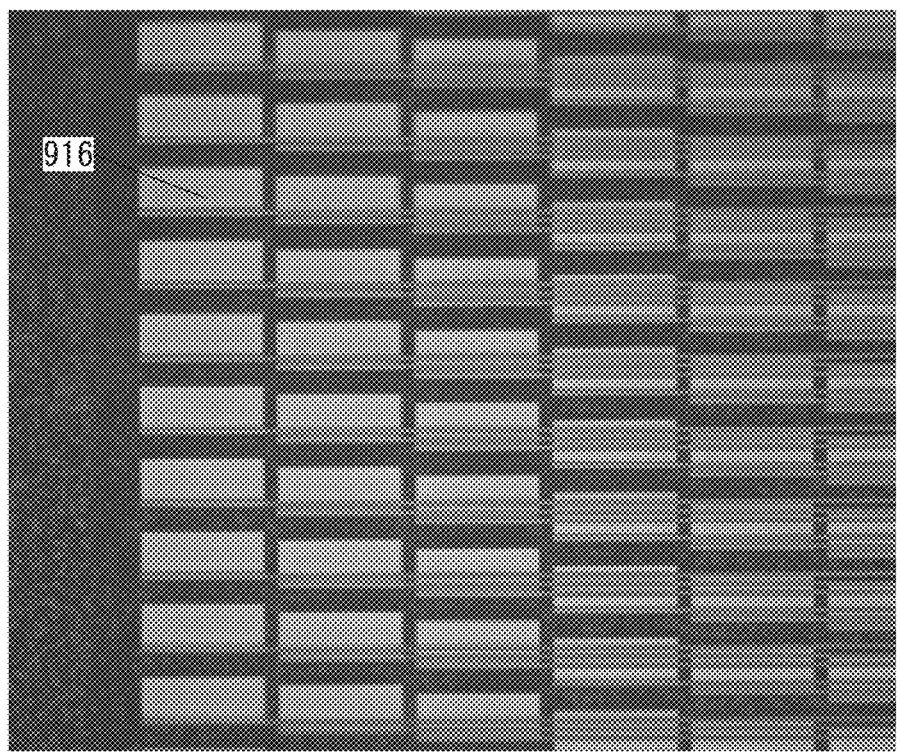

FIGS. 27A and 27B show observation results of a connection portion between the terminal electrodes 916 and the bumps 926 after pressure bonding the driver IC 920, which is observed from the flexible substrate 901 side by an optical microscope. FIGS. 27A and 27B are optical micrographs of different portions.

As shown in FIGS. 27A and 27B, there was no crack by pressure bonding in an inorganic insulating film, a wiring in a periphery of the connection portion, or the like, as well as the connection portion itself.

After that, it was found that, when an image was displayed on the flexible display 900 to which the driver IC 920 was pressure bonded, display was able to be performed normally. Therefore, it was found that the bumps 926 of the driver IC 920 and the terminal electrodes 916 of the flexible display 900 were electrically connected to each other without any problem.

This application is based on Japanese Patent Application serial no. 2014-148023 filed with Japan Patent Office on Jul. 18, 2014 and Japanese Patent Application serial no. 2015-087597 filed with Japan Patent Office on Apr. 22, 2015, the entire contents of which are hereby incorporated by reference.

What is claimed is:

1. A method for manufacturing a circuit board comprising:
   a first process;
   a second process;
   a third process;
   a fourth process; and
   a fifth process,
   wherein the first process comprises a step of providing a circuit and an electrode on a first surface of a first substrate,
   wherein the second process comprises a step of providing a reflective layer on the first surface side of the first substrate or a second surface side of a second substrate,
   wherein the third process comprises a step of attaching the first surface and the second surface to each other with a bonding layer therebetween to face each other so that the reflective layer overlaps with the electrode and the reflective layer surrounds part of the electrode,
   wherein the fourth process comprises a step of irradiating at least part of the reflective layer with laser light from a side opposite to the electrode such that a periphery of a region of the first substrate is irradiated with laser light or a periphery of a region of the second substrate is irradiated with laser light, and
   wherein the fifth process comprises a step of removing at least the region of the first substrate or at least the region of the second substrate by pulling the region of the first substrate or the region of the second substrate.

2. The method for manufacturing a circuit board, according to claim 1, wherein the first substrate and the second substrate have flexibility.

3. A method for manufacturing an electronic device comprising a circuit board,
   wherein the electronic device comprises at least one of a battery, a touch sensor, and a housing, and
   wherein the circuit board is manufactured by the method for manufacturing the circuit board according to claim 1.

4. A method for manufacturing a light-emitting device comprising:
   a first process;
   a second process;
   a third process;
   a fourth process;
   a fifth process;
   a sixth process;
   a seventh process;
   an eighth process; and
   a ninth process,
   wherein the first process comprising:
      a step of providing a first peeling layer on a first surface of a first substrate;
      a step of providing a first insulating layer on the first peeling layer;
      a step of providing a terminal electrode on the first insulating layer;
      a step of providing a second insulating layer on the first insulating layer and the terminal electrode; and
      a step of providing a light-emitting element on the second insulating layer,
   wherein the second process comprising:
      a step of providing a second peeling layer on a second surface of a second substrate;
      a step of providing a third insulating layer on the second peeling layer; and
      a step of providing a reflective layer on the third insulating layer,
   wherein the third process comprises a step of overlapping the first substrate and the second substrate with each other with a bonding layer therebetween in such a manner that the first surface and the second surface face each other so that the reflective layer overlaps with the terminal electrode and the reflective layer surrounds part of the terminal electrode,
   wherein the fourth process comprises a step of peeling the first substrate and the first peeling layer from the first insulating layer,
   wherein the fifth process comprises a step of providing a third substrate to overlap with the first insulating layer,
   wherein in the fifth process, the third substrate has flexibility,
   wherein the sixth process comprises a step of peeling the second substrate and the second peeling layer from the third insulating layer,
   wherein the seventh process comprises a step of providing a fourth substrate to overlap with the third insulating layer,
   wherein in the seventh process, the fourth substrate comprises a first region in which the fourth substrate overlaps with a region surrounded by the reflective layer, the bonding layer comprises a second region in which the bonding layer overlaps with the first region, and the fourth substrate has flexibility,
   wherein the eighth process comprises a step of irradiating at least part of the reflective layer with laser light from the fourth substrate side, and
   wherein the ninth process comprises a step of removing at least part of the first region of the fourth substrate and at least part of the second region of the bonding layer.

5. A method for manufacturing an electronic device comprising a light-emitting device,
   wherein the electronic device comprises at least one of a battery, a touch sensor, and a housing, and
   wherein the light-emitting device is manufactured by the method for manufacturing the light-emitting device according to claim 4.

6. A method for manufacturing a semiconductor device, the method comprising the steps of:
   forming an electrode and a reflective layer so that the electrode and the reflective layer overlap each other between a first substrate and a first surface of a second substrate and the reflective layer is between the electrode and the second substrate;
   irradiating a periphery of a region of the second substrate with laser light from a second surface of the second substrate such that the reflective layer and the periphery of the region of the second substrate overlap each other; and
   removing at least the region of the second substrate by pulling the region of the second substrate.

7. The method for manufacturing a semiconductor device, according to claim 6, the method further comprising the step of connecting a flexible printed circuit to the electrode.

8. The method for manufacturing a semiconductor device, according to claim 6,
   wherein the electrode is exposed by removing the region of the second substrate.

9. The method for manufacturing a semiconductor device, according to claim 6,
   wherein the region of the second substrate is removed by applying mechanical force.

10. The method for manufacturing a semiconductor device, according to claim 6,
wherein the region of the second substrate is removed by bonding an adhesive tape to the region of the second substrate and then pulling the adhesive tape.

11. The method for manufacturing a semiconductor device, according to claim 6,
wherein the region of the second substrate is removed by pulling the region of the second substrate while rolling a structure body having a rotation axis and a suction mechanism on a surface of the region of the second substrate.

12. The method for manufacturing a semiconductor device, according to claim 6,
wherein in the step of forming the electrode and the reflective layer, the electrode is formed on the first substrate and the reflective layer is formed on the first surface of the second substrate.

13. The method for manufacturing a semiconductor device, according to claim 6,
wherein in the step of forming the electrode and the reflective layer, the electrode is formed on the first substrate and the reflective layer is formed on the electrode.

14. The method for manufacturing a semiconductor device, according to claim 6,
wherein in the step of forming the electrode and the reflective layer, the reflective layer is formed on the first surface of the second substrate and the electrode is formed on the reflective layer.

15. The method for manufacturing a semiconductor device, according to claim 6,
wherein the first substrate and the second substrate are attached to each other with a bonding layer provided therebetween.

16. The method for manufacturing a semiconductor device, according to claim 15,
wherein in the step of removing at least the region of the second substrate, a part of the bonding layer is removed.

* * * * *